(12) United States Patent
Inomata et al.

(10) Patent No.: US 7,593,193 B2
(45) Date of Patent: *Sep. 22, 2009

(54) MAGNETORESISTIVE ELEMENT AND MAGNETIC MEMORY DEVICE

(75) Inventors: Koichiro Inomata, Yokohama (JP);
Kentaro Nakajima, Yokohama (JP);
Yoshiaki Saito, Kawasaki (JP);
Masayuki Sagoi, Yokohama (JP);
Tatsuya Kishi, Yokohama (JP)

(73) Assignee: Kabushiki Kaisha Toshiba, Kawasaki-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/847,496

(22) Filed: Aug. 30, 2007

(65) Prior Publication Data

US 2007/0297101 A1    Dec. 27, 2007

Related U.S. Application Data

(62) Division of application No. 11/367,483, filed on Mar. 6, 2006, now Pat. No. 7,345,852, which is a division of application No. 11/110,869, filed on Apr. 21, 2005, now Pat. No. 7,038,894, which is a division of application No. 10/797,136, filed on Mar. 11, 2004, now Pat. No. 6,987,653, which is a division of application No. 10/443,830, filed on May 23, 2003, now Pat. No. 6,751,074, which is a division of application No. 09/662,117, filed on Sep. 14, 2000, now Pat. No. 6,611,405.

(30) Foreign Application Priority Data

| Sep. 16, 1999 | (JP) | 11-262327 |
| Sep. 17, 1999 | (JP) | 11-263741 |
| Sep. 1, 2000 | (JP) | 2000-265663 |
| Sep. 1, 2000 | (JP) | 2000-265664 |

(51) Int. Cl.
*G11B 5/39* (2006.01)
*G11C 11/14* (2006.01)
*G11C 11/15* (2006.01)

(52) U.S. Cl. .................... 360/314; 365/158; 365/171; 365/173

(58) Field of Classification Search .............. 360/324.2, 360/314; 365/158, 171, 173; 257/421–427
See application file for complete search history.

(56) References Cited

U.S. PATENT DOCUMENTS 4,780,848 A    10/1988    Daughton et al.

(Continued)

FOREIGN PATENT DOCUMENTS

DE    19744095 A1    4/1999

(Continued)

OTHER PUBLICATIONS

F. Montaigne, et al., Applied Physics Letters, "Enhanced Tunnel Magnetoresistance at High Bias Voltage in Double-Barrier Planar Junctions", vol 73, No, 19, pp. 2829-2831 (Nov. 9, 1998).

(Continued)

*Primary Examiner*—William J Klimowicz
(74) *Attorney, Agent, or Firm*—Oblon, Spivak, McClelland, Maier & Neustadt, L.L.P.

(57) ABSTRACT

A magnetoresistive element has a ferromagnetic double tunnel junction having a stacked structure of a first antiferromagnetic layer/a first ferromagnetic layer/a first dielectric layer/a second ferromagnetic layer/a second dielectric layer/a third ferromagnetic layer/a second antiferromagnetic layer. The second ferromagnetic layer that is a free layer consists of a Co-based alloy or a three-layered film of a Co-based alloy/a Ni—Fe alloy/a Co-based alloy. A tunnel current is flowed between the first ferromagnetic layer and the third ferromagnetic layer.

1 Claim, 17 Drawing Sheets

U.S. PATENT DOCUMENTS

| | | | |
|---|---|---|---|
| 5,287,238 A | | 2/1994 | Baumgart et al. |
| 5,304,975 A | | 4/1994 | Saito et al. |
| 5,343,422 A | | 8/1994 | Kung et al. |
| 5,365,212 A | | 11/1994 | Saito et al. |
| 5,500,633 A | | 3/1996 | Saito et al. |
| 5,523,172 A | | 6/1996 | Saito et al. |
| 5,534,355 A | | 7/1996 | Okuno et al. |
| 5,578,385 A | | 11/1996 | Saito et al. |
| 5,587,943 A | | 12/1996 | Torok et al. |
| 5,616,370 A | | 4/1997 | Okuno et al. |
| 5,636,093 A | | 6/1997 | Gijs et al. |
| 5,640,343 A | | 6/1997 | Gallagher et al. |
| 5,654,566 A | | 8/1997 | Johnson |
| 5,700,588 A | | 12/1997 | Saito et al. |
| 5,716,719 A | | 2/1998 | Saito et al. |
| 5,747,859 A | | 5/1998 | Mizushima et al. |
| 5,757,056 A | | 5/1998 | Chui |
| 5,773,156 A | | 6/1998 | Inomata et al. |
| 5,838,608 A | | 11/1998 | Zhu et al. |
| 5,894,447 A | | 4/1999 | Takashima |
| 5,930,164 A | | 7/1999 | Zhu |
| 5,946,227 A | | 8/1999 | Naji |
| 5,953,248 A | | 9/1999 | Chen et al. |
| 5,969,978 A | | 10/1999 | Prinz |
| 5,973,334 A | * | 10/1999 | Mizushima et al. ........... 257/25 |
| 5,991,193 A | | 11/1999 | Gallagher et al. |
| 6,052,263 A | * | 4/2000 | Gill ....................... 360/324.11 |
| 6,069,820 A | | 5/2000 | Inomata et al. |
| 6,072,718 A | | 6/2000 | Abraham et al. |
| 6,097,626 A | | 8/2000 | Brug et al. |
| 6,114,719 A | * | 9/2000 | Dill et al. ................... 257/295 |
| 6,124,711 A | * | 9/2000 | Tanaka et al. ............... 324/252 |
| 6,130,835 A | | 10/2000 | Scheuerlein |
| 6,143,477 A | | 11/2000 | Rhieu |
| 6,166,948 A | | 12/2000 | Parkin et al. |
| 6,178,074 B1 | | 1/2001 | Gill |
| 6,178,112 B1 | | 1/2001 | Bessho et al. |
| 6,211,559 B1 | * | 4/2001 | Zhu et al. ................... 257/421 |
| 6,259,586 B1 | * | 7/2001 | Gill ......................... 360/324.2 |
| 6,275,363 B1 | | 8/2001 | Gill |
| 6,351,408 B1 | | 2/2002 | Schwarzl et al. |
| 6,365,286 B1 | | 4/2002 | Inomata et al. |
| 6,381,171 B1 | | 4/2002 | Inomata et al. |
| 6,473,336 B1 | | 10/2002 | Nakajima et al. |
| 6,556,473 B2 | | 4/2003 | Saito et al. |
| 6,590,750 B2 | | 7/2003 | Abraham et al. |
| 6,593,608 B1 | | 7/2003 | Sharma et al. |
| 6,611,405 B1 | | 8/2003 | Inomata et al. |
| 6,667,901 B1 | | 12/2003 | Perner et al. |
| 6,707,711 B2 | | 3/2004 | Saito et al. |
| 6,868,002 B2 | | 3/2005 | Saito et al. |

FOREIGN PATENT DOCUMENTS

| | | |
|---|---|---|
| EP | 1 085 586 A2 | 3/2001 |
| EP | 1 117 136 A1 | 7/2001 |
| JP | 9-251618 | 9/1997 |
| JP | 9-260743 | 10/1997 |
| JP | 10-4227 | 1/1998 |
| JP | 10 083523 A | 3/1998 |
| JP | 10 107337 A | 4/1998 |
| JP | 10-124823 | 5/1998 |
| JP | 10-154311 | 6/1998 |
| JP | 10 177706 A | 6/1998 |
| JP | 10-341048 | 12/1998 |
| JP | 11-86235 | 3/1999 |
| JP | 11-97762 | 4/1999 |
| JP | 11-163436 | 6/1999 |
| JP | 11-177161 | 7/1999 |
| JP | 11-203634 | 7/1999 |
| JP | 11-213650 | 8/1999 |
| JP | 11-238924 A | 8/1999 |
| JP | 11-238925 | 8/1999 |
| JP | 3004005 | 1/2000 |
| JP | 2000-100154 | 4/2000 |
| JP | 2000106462 A | 4/2000 |
| KR | 1999-00336653 | 5/1999 |
| WO | WO 99/18578 A1 | 4/1999 |
| WO | WO 01/71735 A1 | 9/2001 |

OTHER PUBLICATIONS

J.C. Slonczewski, Journal of Magnetism and Magnetic Materials, "Current-Driven Excitation of Magnetic Multilayers", vol. 159, pp. L1-L7 (1996).

J.Z. Sun, Journal of Magnetism and Magnetic Materials, "Current-Driven Magnetic Switching in Manganite Trilayer Junctions", vol. 202, pp. 157-162 (1999).

J.S. Moodera, et al., Physical Review Letters, "Large Magnetoresistance at Room Temperature in Ferromagnetic Thin Film Tunnel Junctions", vol. 74, No. 16, pp. 3273-3276 (Apr. 17, 1995).

X. Zhang, et al., Physical Review B "Spin-Polarized Tunneling and Magnetoresistance in Ferromagnet/Insulator (Semiconductor) Single and Double Tunnel Junctions Subjected to an Electric Field", vol. 56, No. 9, pp. 5484-5485 (Sep. 1, 1997).

L.F. Schlep, et al., Physical Review B, "Spin-Dependent Tunneling with Coulomb Blockage", vol. 56, No. 10, pp. R5747-R5750 (Sep. 1, 1997).

J.S. Moodera, et al., J. Appl. Phys., "Ferromagnetic-Insulator-Ferromagnetic Tunneling: Spin-Dependent Tunneling and Large Magnetoresistance in Trilayer Junctions (invited)", vol. 79, No. 8, pp. 4724-4729 (Apr. 15, 1996).

R.C. Sousa, et al., Mat. Res. Soc. Symp. Proc., vol. 517, pp. 97-102 (1998).

J. A. Katine, et al. "Current-Driven Magnetization Reversal and Spin-Wave Excitations in Co/Cu/Co Pillars", Physical Review Letters, The American Physical Society, vol. 84, No. 14, Apr. 3, 2000, pp. 3149-3152.

E. B. Myers, et al. "Current-Induced Switching of Domains in Magnetic Multilayer Devices", Science, www.sciencemag.org, vol. 285, Aug. 6, 1999, pp. 867-870.

"Associative Store," IBM Technical Disclosure Bulletin, vol. 11, Iss. No. 12, pp. 1788-1789 (May 1, 1969).

* cited by examiner

MAGNETORESISTIVE ELEMENT AND MAGNETIC MEMORY DEVICE

This is a divisional application of U.S. application Ser. No. 11/367,483, filed Mar. 6, 2006, now U.S. Pat. No. 7,345,852, which is a divisional application of U.S. application Ser. No. 11/110,869, filed Apr. 21, 2005, now U.S. Pat. No. 7,038,894, which is divisional of U.S. application Ser. No. 10/797,136, filed Mar. 11, 2004, now U.S. Pat. No. 6,987,653, which is a divisional of U.S. application Ser. No. 10/443,830, filed May 23, 2003, now U.S. Pat. No. 6,751,074, which is a divisional of U.S. application Ser. No. 09/662,117, filed Sep. 14, 2000, now U.S. Pat. No. 6,611,405.

CROSS-REFERENCE TO RELATED APPLICATIONS

This application is based upon and claims the benefit of priority from the prior Japanese Patent Applications No. 11-262327, filed Sep. 16, 1999; No. 11-263741, filed Sep. 17, 1999; No. 2000-265663, filed Sep. 1, 2000; and No. 2000-265664, filed Sep. 1, 2000, the entire contents of which are incorporated herein by reference.

BACKGROUND OF THE INVENTION

The present invention relates to a magnetoresistive element having ferromagnetic double tunnel junction, and, a magnetic memory device using the same.

The magnetoresistance effect is a phenomenon that electrical resistance changes when a magnetic field is applied to a ferromagnetic material. As the magnetoresistive element (MR element) using the above effect has superior temperature stability within a wide temperature range, it has been used for a magnetic head and a magnetic sensor, and the like. Recently, a magnetic memory device (a magnetoresistive memory or a magnetic random access memory (MRAM)) has also been fabricated. The magnetoresistive element has been required to have high sensitivity to external magnetic field and quick response.

In recent years, there has been found a magnetoresistive element having a sandwich film in which a dielectric layer is inserted between two ferromagnetic layers, and uses tunnel currents flowing perpendicularly to the film, so-called a ferromagnetic tunnel junction element (tunnel junction magnetoresistive element, TMR). The ferromagnetic tunnel junction element shows 20% or more of a change rate in magnetoresistance (J. Appl. Phys. 79, 4724 (1996)). Therefore, there has been an increased possibility to apply the TMR to a magnetic head and a magnetoresistive memory. However, there is a problem that the magnetoresistance (MR) change is considerably decreased in the ferromagnetic single tunnel junction element, when a voltage to be applied is increased to obtain required output voltage (Phys. Rev. Lett. 74, 3273 (1995)).

There has been proposed a ferromagnetic single tunnel junction element having a structure in which an antiferromagnetic layer is provided in contact with one ferromagnetic layer for the ferromagnetic single tunnel junction to make the ferromagnetic layer to be a magnetization pinned layer (Jpn. Pat. Appln. KOKAI Publication No. 10-4227). However, such an element also has a similar problem that the MR change is considerably decreased when an applied voltage is increased to obtain required output voltage.

On the other hand, there has been theoretically estimated that a magnetoresistive element having a ferromagnetic double tunnel junction forming a stacked structure of Fe/Ge/Fe/Ge/Fe has an increased MR change owing to spin-polarized resonant tunnel effect (Phys. Rev. B56, 5484 (1997)). However, the estimation is based on results at a low temperature (8K), and therefore the above phenomenon is not necessarily caused at room temperature. Note that the above element does not use a dielectric such as $Al_2O_3$, $SiO_2$, and AlN. Moreover, as the ferromagnetic double tunnel junction element of the above structure has no ferromagnetic layer pinned with an antiferromagnetic layer, there is a problem that the output is gradually decreased owing to rotation of a part of magnetic moments in a magnetization pinned layer by performing writing several times when it is used for MRAM and the like.

In addition, there has been proposed a ferromagnetic multiple tunnel junction element comprising a dielectric layer in which magnetic particles are dispersed (Phys. Rev. B56 (10), R5747 (1997); Journal of Applied Magnetics, 23, 4-2, (1999); and Appl. Phys. LeTT. 73 (19), 2829(1998)). It has been expected that the element may be applied to a magnetic head or a magnetoresistive memory, as 20% or more of an MR change has been realized. In particular, the ferromagnetic double tunnel junction element has an advantage that the reduction in the MR change can be made low even with increased applied voltage. However, as the element has no ferromagnetic layer pinned with an antiferromagnetic layer, there is a problem that the output is gradually decreased owing to rotation of a part of magnetic moments in a magnetization pinned layer by performing writing several times when it is used for MRAM and the like. As a ferromagnetic double tunnel junction element using a ferromagnetic layer consisting of a continuous film (Appl. Phys. Lett. 73(19), 2829(1998)) has a ferromagnetic layer consisting of a single layer film of, for example, Co, $Ni_{80}Fe_{20}$ between dielectric layers, there are problems that a reversal magnetic field for reversing the magnetic moment may not be freely designed, and that coercive force of the ferromagnetic layer may be increased when the material such as Co is processed.

For application of the ferromagnetic tunnel junction element to MRAM and the like, external magnetic fields are applied to a ferromagnetic layer (free layer, or a magnetic recording layer), magnetization of which is not pinned, by flowing current in a wire (bit line or word line) in order to reverse the magnetization of the magnetic recording layer. However, since increased magnetic fields (switching magnetic fields) are required for reversing the magnetization of the magnetic recording layer as memory cells become smaller, it is necessary to flow a high current in the wire for writing. Thus, power consumption is increased for writing as memory capacity of the MRAM is increased. For example, in an MRAM device with a high density of 1 Gb or more, there may be caused a problem that the wires melt owing to increased current density for writing in the wires.

As one solution for the above problem, an attempt is made to carry out magnetization reversal by injecting spin-polarized current (J. Mag. Mag. Mat., 159 (1996) L1; and J. Mag. Mag. Mat., 202(1999) 157). However, the method for performing magnetization reversal by injection of the spin current causes increase in current density in the TMR element, which leads to destruction of a tunnel insulator. Moreover, there have been no proposals for an element structure suitable for spin injection.

BRIEF SUMMARY OF THE INVENTION

An object of the present invention is to provide a magnetoresistive element of a tunnel junction type and a magnetic memory device in that reduction in the MR change can be made low even when an applied voltage is increased to obtain required output voltage, that have no problem that an output is gradually decreased owing to rotation of a part of magnetic moments in the magnetization pinned layer by repeated writing, and in that an reversal magnetic field for reversing the magnetic moments in the ferromagnetic layer can be freely designed.

Another object of the present invention is to provide a magnetoresistive element of a tunnel junction type and a magnetic memory device that can suppress increase in reversal magnetic field for reversing the magnetization of the magnetic recording layer accompanying scaling down of memory cells.

Still another object of the present invention is to provide a magnetic memory device that has a structure suitable for spin injection and can control current density in a wire and a TMR element, and a method for writing information to the magnetic memory device.

A first magnetoresistive element of the present invention comprises a ferromagnetic double tunnel junction having a stacked structure of a first antiferromagnetic layer/a first ferromagnetic layer/a first dielectric layer/a second ferromagnetic layer/a second dielectric layer/a third ferromagnetic layer/a second antiferromagnetic layer; the second ferromagnetic layer consists of a Co-based alloy, or a three-layered film of a Co-based alloy/a Ni—Fe alloy/a Co-based alloy; and a tunnel current is flowed between the first ferromagnetic layer and the third ferromagnetic layer.

A second magnetoresistive element of the present invention comprises a ferromagnetic double tunnel junction having a stacked structure of a first ferromagnetic layer/a first dielectric layer/a second ferromagnetic layer/a first antiferromagnetic layer/a third ferromagnetic layer/a second dielectric layer/a fourth ferromagnetic layer; the first and fourth ferromagnetic layers consist of a Co-based alloy or a three-layered film of a Co-based alloy/a Ni—Fe alloy/a Co-based alloy; and a tunnel current is flowed between the first ferromagnetic layer and the fourth ferromagnetic layer.

A third magnetoresistive element of the present invention comprises a ferromagnetic double tunnel junction having a stacked structure of a first antiferromagnetic layer/a first ferromagnetic layer/a first dielectric layer/a second ferromagnetic layer/a second antiferromagnetic layer/a third ferromagnetic layer/a second dielectric layer/a fourth ferromagnetic layer/a third antiferromagnetic layer; the first and fourth ferromagnetic layers or the second and third ferromagnetic layers consist of a Co-based alloy or a three-layered film of a Co-based alloy/a Ni—Fe alloy/a Co-based alloy; and a tunnel current being flowed between the first ferromagnetic layer and the fourth ferromagnetic layer.

A fourth magnetoresistive element of the present invention comprises a ferromagnetic double tunnel junction having a stacked structure of a first ferromagnetic layer/a first dielectric layer/a second ferromagnetic layer/a first non-magnetic layer/a third ferromagnetic layer/a second nonmagnetic layer/a fourth ferromagnetic layer/a second dielectric layer/a fifth ferromagnetic layer; the second, third and fourth ferromagnetic layers adjacent to each other are antiferromagnetically coupled through the nonmagnetic layers; the first and fifth ferromagnetic layers consist of a Co-based alloy or a three-layered film of a Co-based alloy/a Ni—Fe alloy/a Co-based alloy; and a tunnel current is flowed between the first ferromagnetic layer and the fifth ferromagnetic layer.

In the magnetoresistive elements of the present invention, the thickness of the Co-based alloy or the above three-layered film of the Co-based alloy/the Ni—Fe alloy/the Co-based alloy is preferably 1 to 5 nm.

A magnetic memory device of the present invention comprises a transistor or a diode, and any one of the first to fourth magnetoresistive element.

The magnetic memory device of the present invention comprises a transistor or a diode and the first or third magnetoresistive element, and at least the uppermost antiferromagnetic layer in the magnetoresistive element constitutes a part of a bit line.

Another magnetic memory device of the present invention comprises a first magnetization pinned layer whose magnetization direction is pinned, a first dielectric layer, a magnetic recording layer whose magnetization direction is reversible, a second dielectric layer, and a second magnetization pinned layer whose magnetization direction is pinned; the magnetic recording layer comprises the three-layered film of a magnetic layer, a nonmagnetic layer and a magnetic layer, two magnetic layers constituting the three-layered film being antiferromagnetically coupled; and magnetization directions of the magnetization pinned layers in regions in contact with the dielectric layer are substantially anti-parallel to each other.

Still another magnetic memory device of the present invention comprises, a first magnetization pinned layer whose magnetization direction is pinned, a first dielectric layer, a magnetic recording layer whose magnetization direction is reversible, a second dielectric layer, and a second magnetization pinned layer whose magnetization direction is pinned; the magnetic recording layer comprising a three-layered film of a magnetic layer, a nonmagnetic layer and a magnetic layer, the two magnetic layers constituting the three-layered film being antiferromagnetically coupled; the second magnetization pinned layer comprising a three-layered film of a magnetic layer, a nonmagnetic layer and a magnetic layer, the two magnetic layers constituting the three-layered film being antiferromagnetically coupled; a length of the first magnetization pinned layer being formed longer than those of the second magnetization pinned layer and the magnetic recording layer; and magnetization directions of the two magnetization pinned layers in regions in contact with the dielectric layer being substantially anti-parallel to each other.

A method for writing information to the above magnetic memory devices comprises steps of: supplying the magnetic recording layer with a spin current through the first or second magnetization pinned layer; and flowing a current in a wire for writing so as to apply a current magnetic field to the magnetic recording layer.

Still another magnetoresistive element of the present invention comprises a ferromagnetic double tunnel junction having a stacked structure of a first antiferromagnetic layer/a first ferromagnetic layer/a first tunnel insulator/a second ferromagnetic layer/a first nonmagnetic layer/a third ferromagnetic layer/a second nonmagnetic layer/a fourth ferromagnetic layer/a second tunnel insulator/a fifth ferromagnetic layer/a second antiferromagnetic layer; the second and third ferromagnetic layers are antiferromagnetically coupled through the first nonmagnetic layer; and the third and fourth ferromagnetic layers are antiferromagnetically coupled through the second nonmagnetic layer.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Basic structures of magnetoresistive elements according to the present invention will be described hereinafter, referring to FIGS. 1 to 4.

Figure 1:
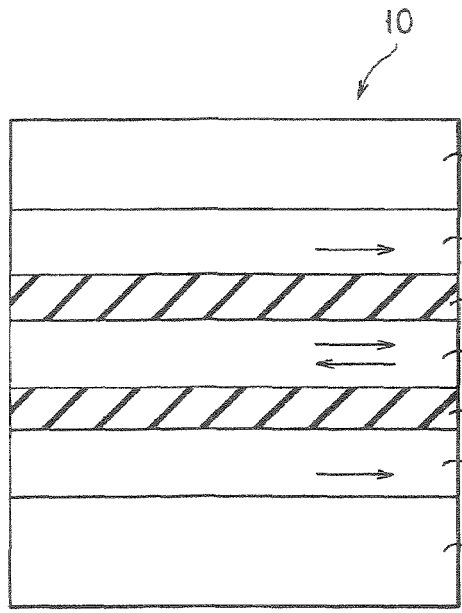
FIG. 1 shows a sectional view of a basic structure of a first magnetoresistive element of the present invention.

FIG. 1 shows a first magnetoresistive element of the present invention. The magnetoresistive element 10 forms a ferromagnetic double tunnel junction having a stacked structure of a first antiferromagnetic layer 11/a first ferromagnetic layer 12/a first dielectric layer 13/a second ferromagnetic layer 14/a second dielectric layer 15/a third ferromagnetic layer 16/a second antiferromagnetic layer 17. In the element, a tunnel current is flowed between the first ferromagnetic layer and the third ferromagnetic layer. In the element, the first and third ferromagnetic layers 12, 16 are a pinned layer (a magnetization pinned layer), and the second ferromagnetic layer 14 is a free layer (a magnetic recording layer in the case of an MRAM). In the first magnetoresistive element, the second ferromagnetic layer 14 that is a free layer consists of a Co-based alloy (for example, Co—Fe, Co—Fe—Ni, and the like) or a three-layered film of a Co-based alloy/a Ni—Fe alloy/a Co-based alloy.

Figure 2:
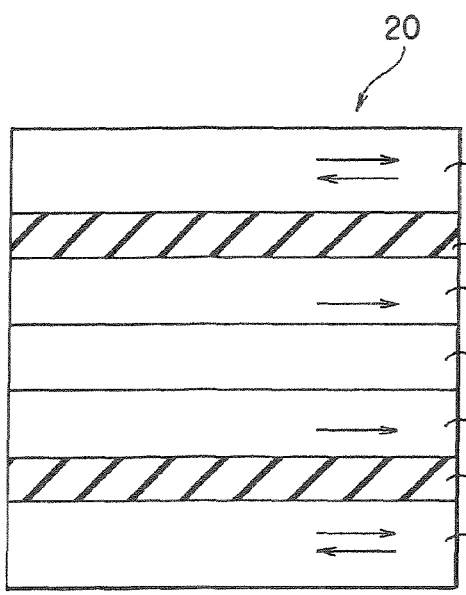
FIG. 2 shows a sectional view of a basic structure of a second magnetoresistive element of the present invention.

FIG. 2 shows a second magnetoresistive element of the present invention. The magnetoresistive element 20 forms a ferromagnetic double tunnel junction having a stacked structure of a first ferromagnetic layer 21/a first dielectric layer 22/a second ferromagnetic layer 23/an antiferromagnetic layer 24/a third ferromagnetic layer 25/a second dielectric layer 26/a fourth ferromagnetic layer 27. In the element, a tunnel current is flowed between the first ferromagnetic layer and the fourth ferromagnetic layer. In the element, the second and third ferromagnetic layers 23, 25 are a pinned layer, and the first and fourth ferromagnetic layers 21, 27 are a free layer (a magnetic recording layer in the case of an MRAM). In the second magnetoresistive element, the first and fourth ferromagnetic layers 21, 27 that are a free layer consist of a Co-based alloy (for example, Co—Fe, Co—Fe—Ni, and the like) or a three-layered film of a Co-based alloy/a Ni—Fe alloy/a Co-based alloy.

Figure 3:
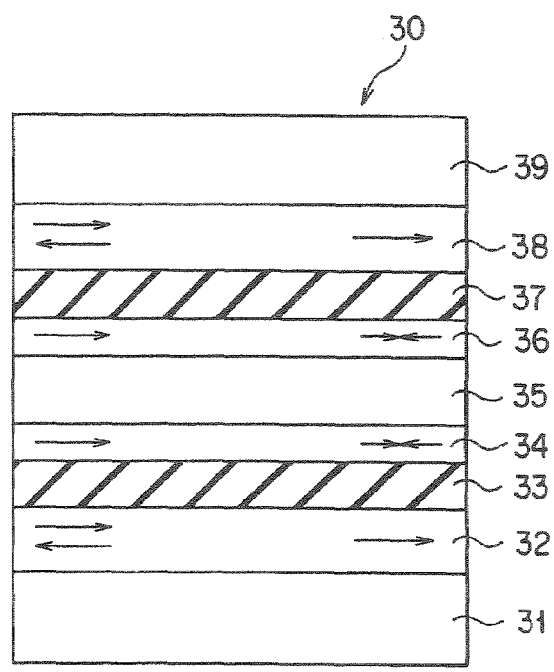
FIG. 3 shows a sectional view of a basic structure of a third magnetoresistive element of the present invention.

FIG. 3 shows a third magnetoresistive element of the present invention. The magnetoresistive element 30 forms a ferromagnetic double tunnel junction having a stacked structure of a first antiferromagnetic layer 31/a first ferromagnetic layer 32/a first dielectric layer 33/a second ferromagnetic layer 34/a second antiferromagnetic layer 35/a third ferromagnetic layer 36/a second dielectric layer 37/a fourth ferromagnetic layer 38/a third antiferromagnetic layer 39. In the element, a tunnel current is flowed between the first ferromagnetic layer and the fourth ferromagnetic layer. In the element, when the second and third ferromagnetic layers 34, 36 are designed as a pinned layer, the first and fourth ferromagnetic layers 32, 38 are made to be a free layer (a magnetic recording layer in the case of an MRAM). On the other hand, when the first and fourth ferromagnetic layers 32, 38 are designed as a pinned layer, the second and third ferromagnetic layers 34, 36 are made to be a free layer (a magnetic recording layer, in the case of an MRAM). In the third magnetoresistive element, either a group of the first and fourth ferromagnetic layers 34, 36, or that of the second and third ferromagnetic layers 34, 36, each of which is used as a free layer, consists of a Co-based alloy (for example, Co—Fe, Co—Fe—Ni, and the like) or a three-layered film of a Co-based alloy/a Ni—Fe alloy/a Co-based alloy.

Figure 4:
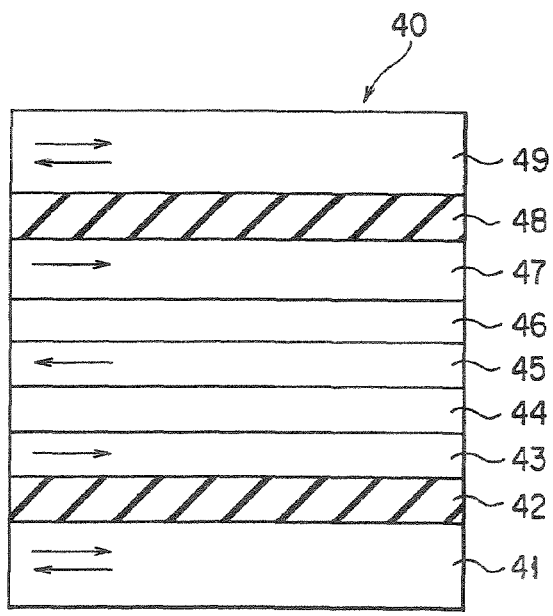
FIG. 4 shows a sectional view of a basic structure of a fourth magnetoresistive element of the present invention.

FIG. 4 shows a fourth magnetoresistive element of the present invention. The magnetoresistive element 40 forms a ferromagnetic double tunnel junction having a stacked structure of a first ferromagnetic layer 41/a first dielectric layer 42/a second ferromagnetic layer 43/a first nonmagnetic layer 44/a third ferromagnetic layer 45/a second nonmagnetic layer 46/a fourth ferromagnetic layer 47/a second dielectric layer 48/a fifth ferromagnetic layer 49. In the element, a tunnel current is flowed between the first ferromagnetic layer and the fifth ferromagnetic layer. In addition, the second, third and fourth ferromagnetic layers 43, 45, 47 adjacent to each other are antiferromagnetically coupled through nonmagnetic layers 44, 46. In the element, the second to fourth ferromagnetic layers 43, 45, 47 are a pinned layer, and the first and fifth ferromagnetic layers 41, 49 are a free layer (a magnetic recording layer in the case of an MRAM). In the fourth magnetoresistive element, the first and fifth ferromagnetic layers 41, 49 that are a free layer consist of a Co-based alloy (for example, Co—Fe, Co—Fe—Ni, and the like) or a three-layered film of a Co-based alloy/a Ni—Fe alloy/a Co-based alloy.

Figure 5:
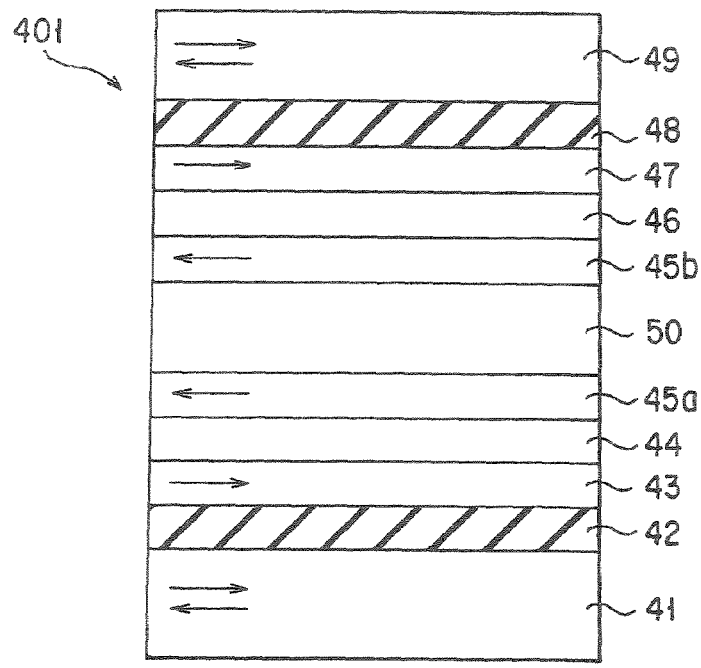
FIG. 5 shows a sectional view of a basic structure of another embodiment of the fourth magnetoresistive element of the present invention.

FIG. 5 shows a variation of the fourth magnetoresistive element. In the magnetoresistive element shown in FIG. 5, a structure in which an antiferromagnetic layer is inserted between the ferromagnetic layers, that is, a three-layered film of a ferromagnetic layer 45a/an antiferromagnetic layer 50/a ferromagnetic layer 45b is provided, instead of the third ferromagnetic layer 45 shown in FIG. 4.

Note that, an antiferromagnetic layer may be provided in contact with at least one of the second and fourth ferromagnetic layers 43, 47 constituting the fourth magnetoresistive element.

As the magnetoresistive elements according to the present invention having a ferromagnetic double tunnel junction comprises at least two dielectric layers, an effective voltage applied to one tunnel junction is low. Therefore, the elements have an advantage that their voltage dependency of MR change is not remarkable, that is, reduction in the MR change is made low even when an applied voltage is increased in order to obtain a required output voltage.

In the above four basic structures of the magnetoresistive element having a ferromagnetic double tunnel junction according to the present invention, spins in the magnetization pinned layer (a pinned layer) are pinned with the antiferromagnetic layer or the antiferromagnetic coupling. Therefore, it may be possible to prevent the problem that the output is gradually decreased owing to rotation of the magnetic moments in the magnetization pinned layer by repeated writing.

In addition, the magnetoresistive elements use a Co-based alloy (Co—Fe and Co—Fe—Ni, and the like) or a three-layered film of a Co-based alloy/a Ni—Fe alloy/a Co-based alloy, whose magnetostriction is low, for the free layer (magnetic recording layer). The free layers are the second ferromagnetic layer 14 in FIG. 1, the first and fourth ferromagnetic layers 21 and 27 in FIG. 2, either a group of the first and fourth ferromagnetic layers 32, 38 or a group of the second and third ferromagnetic layers 34, 36, and the first and the fifth ferromagnetic layer 41, 49 in FIGS. 4 and 5. Therefore, the reversal magnetic field is controlled to a low value, which enables to lower a current flowed in a wire to apply a current magnetic field. When the three-layered film of a Co-based alloy/a Ni—Fe alloy/a Co-based alloy is used for the free layer, magnitude of the reversal magnetic field may be freely designed by control of the thickness ratio of each layer.

In particular, in the magnetoresistive element having the structure shown in FIG. 3, the reversal magnetic field is determined not by the magnetic coercive force of the magnetic material, but by the exchange magnetic field caused on the interface between a magnetic material/antiferromagnetic material. Advantageously, the exchange magnetic field may be freely designed by control of the type, thickness and alloy composition of the first and third antiferromagnetic layers 31, 39 and the second antiferromagnetic layer 35. Thus, the basic structure of FIG. 3 exhibits the most preferable characteristics among the above four basic structures. Moreover, the structure of FIG. 3 is especially effective in the case of where a processing size is lowered to sub-micron and a junction area is made very small. That is, in the case where a processing size is lowered to sub-micron, the writing magnetic field tends to be irregular due to process damage or influence of domains of the free layer (magnetic recording layer). Where an antiferromagnetic layer is provided in contact with the free layer (magnetic recording layer) as the structure shown in FIG. 3, it may be possible to prevent the irregularity of the writing magnetic field, as the writing magnetic field may be designed based on the exchange magnetic field. Therefore, the yield of the element may be remarkably improved.

On the other hand, it is preferable to make the whole thickness of the element thin in order to improve processing accuracy in fine processing of the element of the present invention. In this point, it is preferable to adopt structures as shown in FIGS. 2, 4 and 5 which make it possible to reduce the number of the antiferromagnetic layers as much as possible.

Then, materials for use in each layer of a magnetoresistive element of the present invention will be described below.

As mentioned above, a Co-based alloy (Co—Fe, CO—Fe—Ni, and the like) or a three-layered layer of a Co-based alloy/Ni—Fe alloy/a Co-based alloy is used for the free layer (magnetic recording layer). Further, a small amount of nonmagnetic elements such as Ag, Cu, Au, Al, Mg, Si, Bi, Ta, B, C, O, N, Si, Pd, Pt, Zr, Ir, W, Mo, and Nb may be added to the above alloys. The magnetoresistive element of the present invention may be applied to a magnetoresistive magnetic head, a magnetic memory device, a magnetic field sensor, and the like. In the above applications, it is preferable to provide uniaxial anisotropy to the free layer.

The thickness of the free layer may be preferably 0.1 nm to 100 nm, more preferably 0.5 to 50 nm, and most preferably 1 to 5 nm. When the thickness of the free layer is less than 1 nm, there is a possibility that the free layer is not made into a continuous film, but is made into a so-called granular structure in which ferromagnetic particles are dispersed in a dielectric layer. As a result, it becomes difficult to control the junction characteristics, and there is a possibility that the switching magnetic field becomes irregular. Moreover, there may be caused a problem that fine particles are made to be superparamagnetic at a room temperature which leads to extremely reduction in the MR change. On the other hand, when the thickness of the free layer exceeds 5 nm, the reversal magnetic field may exceed 100 Oe which requires to flow a high current in a wire in a case where, for example, the magnetoresistive element is applied to an MRAM designed by 0.25 μm rule. In addition, when the thickness of the free layer exceeds 5 nm, the MR change is reduced with increased bias voltage, that is, the so-called bias dependency becomes remarkable. If the thickness of the free layer is in a range of 1 to 5 nm, the increase of the reversal magnetic field and the bias dependency of the MR change, which may be caused by fine processing, can be controlled. Moreover, if the thickness of the free layer is in the above range, the processing accuracy also becomes excellent.

Materials used for the pinned layer are not particularly limited, and Fe, Co, Ni or their alloys, a magnetite having high spin polarizability, an oxide such as $CrO_2$ and $RXMnO_{3-y}$ (where R represents an rare earth element, and X represents Ca, Ba or Sr), a Heusler alloy such as NiMnSb and PtMnSb, and the like may be used. The pinned layer is required to be so thick that it does not become superparamagnetic, and may be preferably 0.4 nm or more. Moreover, as long as the ferromagnetism is not lost, a small amount of nonmagnetic elements such as Ag, Cu, Au, Al, Mg, Si, Bi, Ta, B, C, O, N, Si, Pd, Pt, Zr, Ir, W, Mo and Nb may be added to the above magnetic materials.

When the pinned layer is desired to be strongly pinned with the antiferromagnetic layer, a three-layered film of a ferromagnetic layer/a nonmagnetic layer/a ferromagnetic layer may be used as a pinned layer so that the two-layered ferromagnetic layers may be antiferromagnetically coupled through a nonmagnetic layer. Materials for the nonmagnetic layer are not particularly limited, and a metal such as Ru, Ir, Cr, Cu and Rh may be used. The antiferromagnetic coupling can be caused between the magnetic layers by adjusting the thickness of the nonmagnetic layer. The thickness of the nonmagnetic layer may be preferably 0.5 to 2.5 nm. Considering the thermal resistance and the strength of the antiferromagnetic coupling, the thickness of the nonmagnetic layer may be more preferably 0.7 to 1.5 nm. Specifically, a three-layered film such as Co (or Co—Fe)/Ru/Co (or Co—Fe), and Co (or Co—Fe)/Ir/Co (or Co—Fe) may be used.

As materials for the antiferromagnetic layer, Fe—Mn, Pt—Mn, Pt—Cr—Mn, Ni—Mn, Ir—Mn, NiO, $Fe_2O_3$ and the like may be used.

As materials for the dielectric layer, $Al_2O_3$, $SiO_2$, MgO, AlN, $Bi_2O_3$, $MgF_2$, $CaF_2$, $SrTiO_2$ $AlLaO_3$ and the like may be used. The loss of oxygen, nitrogen or fluorine in the dielectric layer may be allowed. Although the thickness of the dielectric layer is not particularly limited, the dielectric layer is preferable made thin, and it may be preferably 10 nm or less, and more preferably 5 nm or less.

A substrate on which a magnetoresistive element of the present invention is formed is not particularly limited. Various types of substrate such as Si, $SiO_2$, $Al_2O_3$, spinel and AlN may be used. In the present invention, the magnetoresistive element may be stacked on the substrate with intervening an underlayer therebetween, and a protective layer may be provided on the magnetoresistive element. As materials for the underlayer and protective layer, Ta, Ti, W, Pt, Pd, Au, Ti/Pt, Ta/Pt, Ti/Pd, Ta/Pd or nitride such as $TiN_x$ may be preferably used.

A magnetoresistive element according to the present invention may be fabricated by depositing each layer with usual deposition methods such as various types of spattering, vacuum evaporation and molecular beam epitaxy.

Next, a magnetic memory device (MRAM) using a magnetoresistive element of the present invention will be described below. The MRAM using the magneto-resistive element of the present invention may obtain an effect that a current flowing in a wire to apply the current magnetic field may be reduced even in both cases of non-destructive reading and destructive reading.

As a specific constitution, there has been conceived a structure in which the ferromagnetic double tunnel junction element is stacked on a transistor, or a structure in which a diode and the ferromagnetic double tunnel junction are stacked. As described below, it is particularly preferable to apply the first or third ferromagnetic double tunnel junction element to the structures, and to use at least the uppermost anti-ferromagnetic magnetic layer as a part of a bit line.

Figure 6:
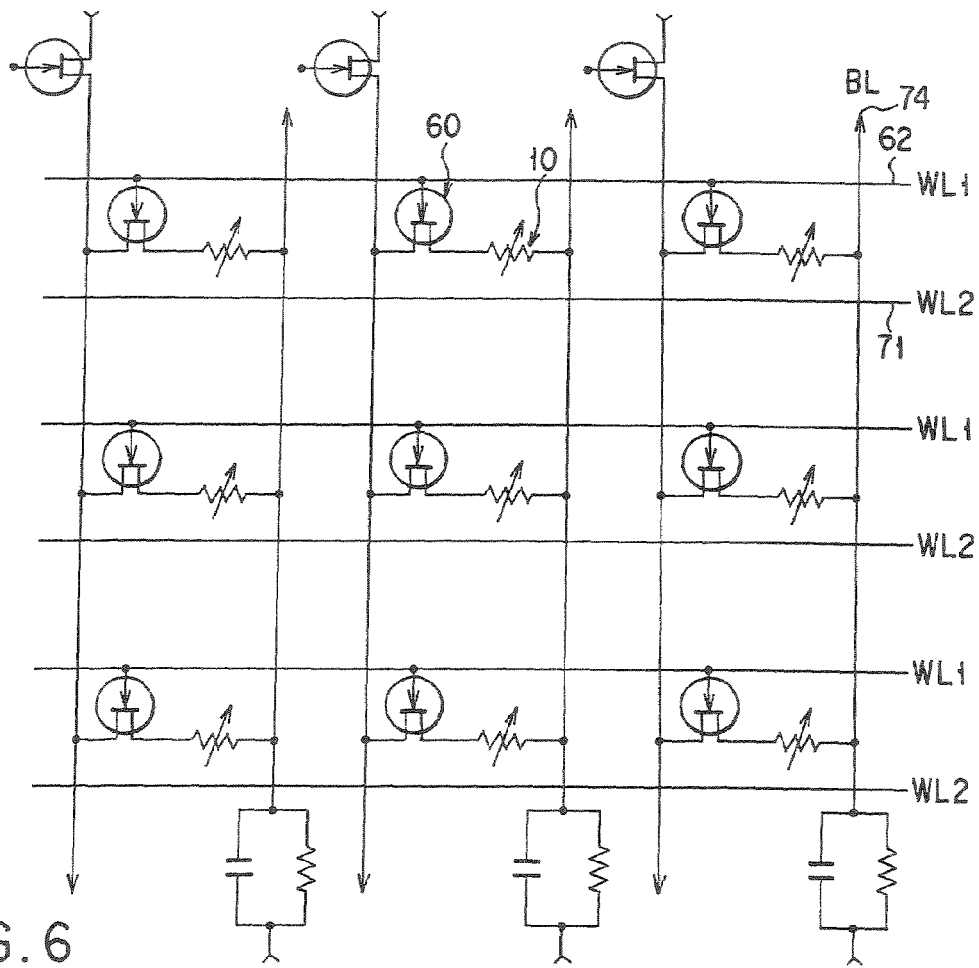
FIG. 6 shows an equivalent circuit diagram of an MRAM combining MOS transistors and ferromagnetic double tunnel junction elements.
Figure 7:
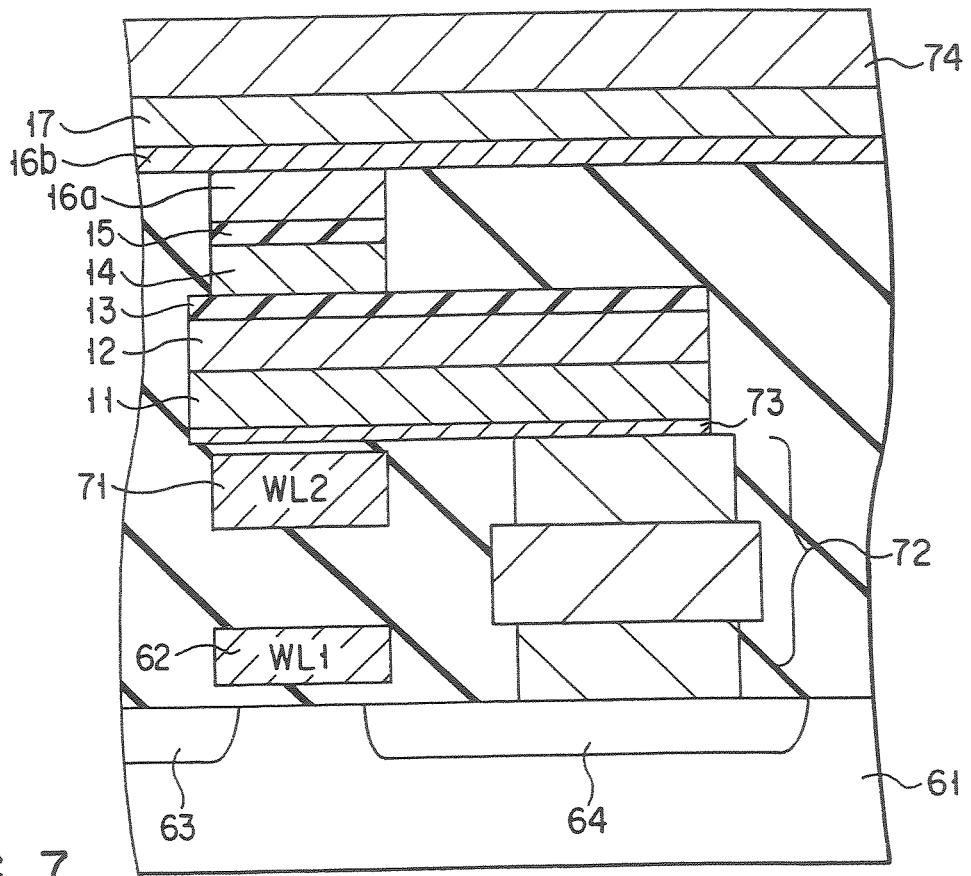
FIG. 7 shows a sectional view of the MRAM in FIG. 6 in which a pinned layer of the ferromagnetic double tunnel junction element constitutes a part of a bit line.

An MRAM having a structure in which, for example, a first ferromagnetic double tunnel junction element (FIG. 1) is stacked on a MOS transistor will be described below, referring to FIGS. 6 and 7. FIG. 6 shows a view of an equivalent circuit of an MFAM of 3×3 cells. FIG. 7 shows a sectional view of an MRAM in a single cell.

As shown in the equivalent circuit diagram of FIG. 6, memory cells each comprising the transistor 60 and the ferromagnetic double tunnel junction element (TMR) 10 of FIG. 1 are arrayed in a matrix. The word line for reading (WL1) 62 constituted by the gate electrode of the transistor 60, and the word line for writing (WL2) 71 are parallel to each other. The bit line (BL) 74 connected to the other end (upper part) of the TMR 10 is arranged in perpendicular to the word line (WL1) 62 and the word line (WL2) 71.

As shown in FIG. 7, the transistor 60 comprises the silicon substrate 61, the gate electrode 62, the source and drain regions 63, 64. The gate electrode 62 constitutes the word line for reading (WL1). The word line for writing (WL2) 71 is formed on the gate electrode 62 and an insulator. The contact metal 72 is connected to the drain region 64 of the transistor 60, and the underlayer 73 is connected to the contact metal 72. The ferromagnetic double tunnel junction element (TMR) 10 of FIG. 1 is provided on the underlayer 73 at a position above the word line for writing (WL2) 71. That is, the following layers are stacked on the underlayer 73: an antiferromagnetic layer 11/a first ferromagnetic layer (pinned layer) 12/a first dielectric layer 13/a second ferromagnetic layer (free layer)

14/a second dielectric layer 15/a third ferromagnetic layers (pinned layers) 16a and 16b/a second antiferromagnetic layer 17. In this embodiment, the pinned layer is constituted by the two layers 16a and 16b. The metal layer of the bit line (BL) 74 is formed on the second antiferromagnetic layer 17 of the TMR 10.

The area of the second ferromagnetic layer 14 of a free layer is different from that of the upper antiferromagnetic layer 17 and the pinned layer 16b. The upper antiferromagnetic layer 17 and the pinned layer 16b form a part of the bit line 74. More specifically, the bit line 74 has a stacked structure of a pinned layer 16b/an antiferromagnetic layer 17/a metalic layer. Note that, the bit line 74 may be constituted by the antiferromagnetic layer 17/the metal layer, without providing the pinned layer 16b having the same area as that of the antiferromagnetic layer 17 under the layer 17.

In this structure, spins in the pinned layers 16b and 16a are more stably pinned with the antiferromagnetic layer 17 having a large area, and magnetic moments in the pinned layers 16b and 16a are not rotated even by repeated writing. Thus, reduction in output can be effectively prevented.

Further, the structure above the free layer 14 of the TMR 10 is formed by deposition and patterning of the free layer 14/the second dielectric layer 15/the pinned layer 16a, and those of the pinned layer 16b/the antiferromagnetic layer 17/the metal layer. Conventionally, the structure above the free layer 14 of the TMR 10 has been formed by deposition and patterning of the free layer 14/the second dielectric layer 15/the pinned layer 16a/the antiferromagnetic layer 17, and those of the bit line metal layer. Thus, when the structure shown in FIG. 7 is adopted, as the patterning process of the comparatively thick antiferromagnetic layer 17 is separated to another process, it is possible to make the thickness of the films to be finely processed at one time thin, in the above former patterning. Therefore, it is possible to reduce process damage to the region of the ferromagnetic tunnel junction, and to improve processing accuracy.

Figure 8:
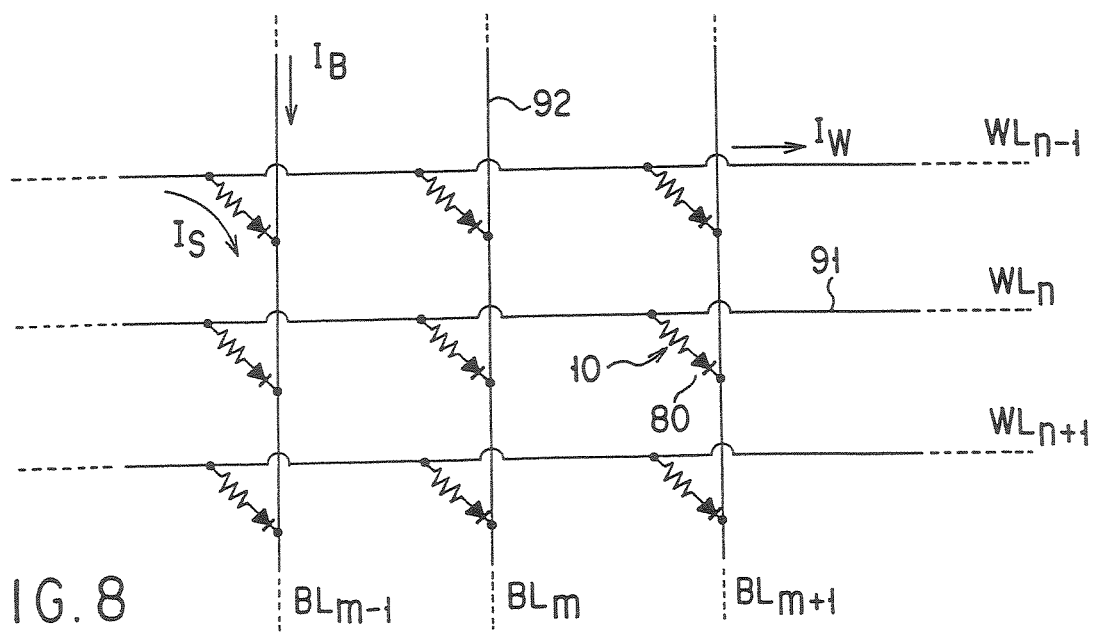
FIG. 8 shows an equivalent circuit diagram of an MRAM combining diodes and ferromagnetic double tunnel junction elements.
Figure 9:
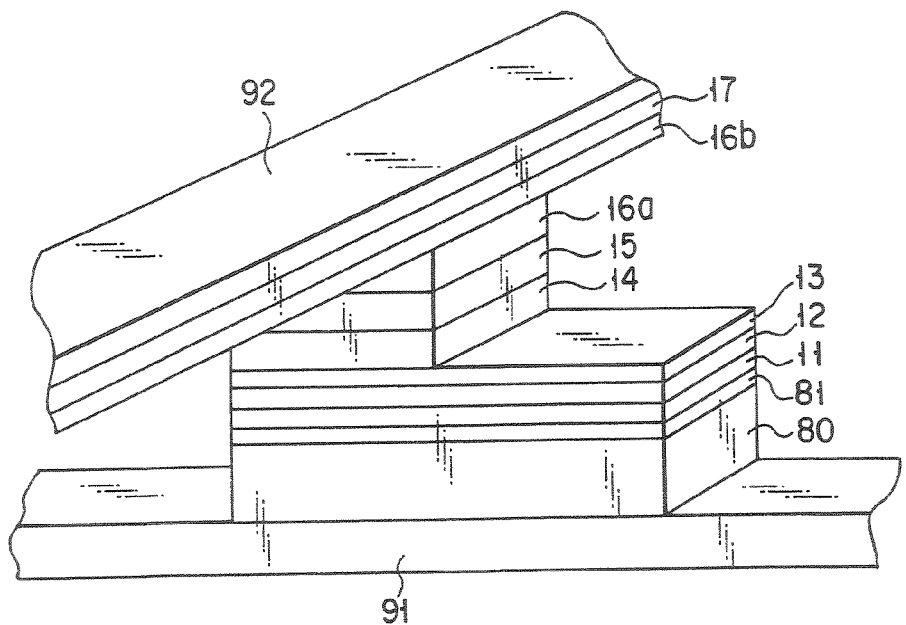
FIG. 9 shows a sectional view of the MRAM in FIG. 8 in which a pinned layer of the ferromagnetic double tunnel junction element constitutes a part of a bit line.

An MRAM having a structure in which a diode and, for example, a first ferromagnetic double tunnel junction element (FIG. 1) will be described below, referring to FIGS. 8 and 9. FIG. 8 shows a view of an equivalent circuit diagram of an MRAM of 3×3 cells. FIG. 9 shows a perspective view of the MRAM.

As shown in the equivalent circuit diagram of FIG. 8, memory cells each having a stacked structure of a diode 80 and TMR 10 are arrayed in a matrix. The stacked structure of the diode 80 and TMR 10 is formed on the word line (WL) 91 such that the word line (WL) 91 is connected to one end of the diode 80. The bit line (BL) 92 arranged in perpendicular to the word line (WL) 91 is connected to the other end of the TMR 10.

As shown in FIG. 9, the silicon diode 80 is formed on the metal layer of the word line (WL) 91, and the underlayer 81 is formed on the diode 80. A nitride film such as $TiN_x$ may be provided between the metal layer and the silicon diode to prevent atomic diffusion. The ferromagnetic double tunnel junction element (TMR) 10 shown in FIG. 1 is formed on the underlayer 81. That is, a first antiferromagnetic layer 11/a first ferromagnetic layer (pinned layer) 12/a first dielectric layer 13/a second ferromagnetic layer (free layer) 14/a second dielectric layer 15/a third ferromagnetic layers (pinned layers) 16a and 16b/a second 30 antiferromagnetic layer 17 are stacked on the underlayer 81. In the above embodiment, the pinned layer is constituted by two layers 16a and 16b. The metal layer of the bit line 92 is formed on the second antiferromagnetic layer 17 of the TMR 10.

The MRAM having such a structure may have the similar effect to that described with respect to FIG. 7. That is, spins in the pinned layers 16b and 16a are more stably pinned by the antiferromagnetic layer 17 having a large area, and magnetic moments in the pinned layers 16b and 16a are not rotated even by repeated writing. Thus, reduction in output can be effectively prevented. In addition, as the patterning process of the comparatively thick antiferromagnetic layer 17 is separated to another process, it is possible to reduce process damage to the region of the ferromagnetic tunnel junction, and to improve processing accuracy.

For application of the MRAM, a three-layered film of a ferromagnetic layer/a nonmagnetic layer/a ferromagnetic layer may be used for a free layer so that the ferromagnetic layers may be anti-ferromagnetically coupled through the nonmagnetic layer. In such a structure, as the magnetic flux is confined in the three-layered film, influence of the static magnetic field to the pinned layer is prevented when the magnetic moments in the free layer is reversed by current magnetic field, and also a leakage magnetic field from the recording layer can be lowered which makes it possible to reduce a switching magnetic field. Thus, it is possible to prevent the problem that the output is gradually decreased owing to rotation of a part of the magnetic moments in the magnetization pinned layer by repeated writing. Preferably, a ferromagnetic layer in the structure of the ferromagnetic layer/the nonmagnetic layer/the ferromagnetic layer, which is closer to the word line for applying the current magnetic field, is made of a softer ferromagnetic material or made thicker. When the two ferromagnetic layers forming the three-layered film are made to have a different thickness from each other, it is preferable to make the thickness difference within the range of 0.5 to 5 nm.

Another MRAM according to the present invention will be described below. This MRAM comprises a ferromagnetic double tunnel junction element having a first magnetization pinned layer with a pinned magnetization direction, a first dielectric layer, a magnetic recording layer with a reversible magnetization direction, a second dielectric layer, and a second magnetization pinned layer with a pinned magnetization direction. The magnetic recording layer comprises a three-layered film of a magnetic layer, a nonmagnetic layer and a magnetic layer, and the two magnetic layers constituting the three-layered film are antiferromagnetically coupled. Since the two magnetic layers are antiferromagnetically coupled and the magnetic flux is confined in the magnetic recording layer, it may be possible to reduce the switching magnetic field and the current density flowing in a wire. The magnetization directions in the regions of the two magnetization pinned layers in contact with the dielectric layers are substantially anti-parallel to each other. Thus, it may be possible to select either an up-spin current and a down-spin current to be supplied to the magnetic recording layer by choosing a pinned layer for flowing a current to the magnetic recording layer from the two magnetization pinned layers. Therefore, the magnetization of the magnetic recording layer may be easily reversed by changing a direction for supplying the spin current, so that the current flowing in the TMR element may be reduced. Thus, the MRAM has a suitable structure to supply the spin current and the current magnetic field to the magnetic recording layer to control the current density flowing in the wire and the TMR element.

The antiferromagnetically coupled magnetic recording layer forming the above ferromagnetic double tunnel junction element may be easily formed by alternately stacking ferromagnetic layers and nonmagnetic metal layers. Since the thinner the antiferromagnetically coupled magnetic recording layer is the easier fine processing may be possible, it is preferable for the magnetic recording layer to be made of a three-layered film of a ferromagnetic layer/a nonmagnetic metal layer/a ferromagnetic layer. Moreover, a three-layered film of a ferromagnetic layer/a soft magnetic layer/a ferromagnetic layer may be used as the ferromagnetic layer. In particular, when a three-layered film in which a soft magnetic layer such as a Ni—Fe alloy is inserted between two $Co_xFe_{1-x}$ layers (where $0.5 \leq x < 1.0$) is used for the ferromagnetic layer, switching magnetic field may be remarkably made low. The reason is that the Ni—Fe alloy layer is fcc (111) oriented, and then the $Co_xFe_{1-x}$ layer on this layer also is fcc (111) oriented, so that the switching magnetic field of the $Co_xFe_{1-x}$ layer itself is reduced and also total value of magnetization of the ferromagnetic layer is reduced.

Therefore, examples of the antiferromagnetically coupled magnetic recording layer are: (a) a ferromagnetic layer/a nonmagnetic layer/a ferromagnetic layer, (b) (a ferromagnetic layer/a soft magnetic layer/a ferromagnetic layer)/a nonmagnetic layer/a ferromagnetic layer, (c) (a ferromagnetic layer/a soft magnetic layer/a ferromagnetic layer)/a nonmagnetic layer/(a ferromagnetic layer/a soft magnetic layer/a ferromagnetic layer). In this case, strength of antiferromagnetic coupling is preferably as high as 0.01 erg/cm$^2$ or more. The magnetization pinned layers may be antiferromagnetically coupled by forming a stacked structure similar to that of the magnetic recording layer.

Examples of a ferromagnetic double tunnel junction element used for the MRAM will be described below, referring to FIGS. 10 to 12.

Figure 10:
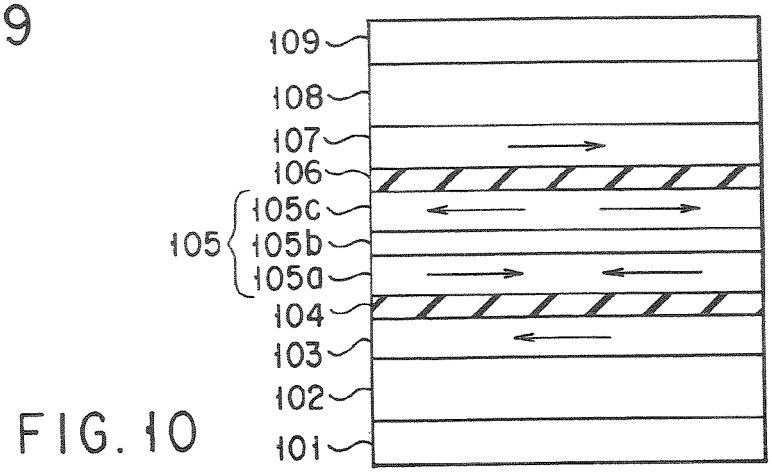
FIG. 10 shows a sectional view of a ferromagnetic double tunnel junction element used for another MRAM of the present invention.

A ferromagnetic double tunnel junction element of FIG. 10 has a stacked structure of an underlayer 101/a first antiferromagnetic layer 102/a first magnetization pinned layer 103/a first dielectric layer 104/a magnetic recording layer 105 comprising a three-layered film of a ferromagnetic layer 105a, a nonmagnetic layer 105b and a ferromagnetic layer 105c/a second dielectric layer 106/a second magnetization pinned layer 107/a second antiferromagnetic layer 108/a protective layer 109.

The ferromagnetic layer 105a and the ferromagnetic layer 105c of the magnetic recording layer 105 are antiferromagnetically coupled. The magnetization directions of the first magnetization pinned layer 103 in contact with the first dielectric layer 104, and the second magnetization pinned layer 107 in contact with the second dielectric layer 106 are anti-parallel to each other.

Figure 11:
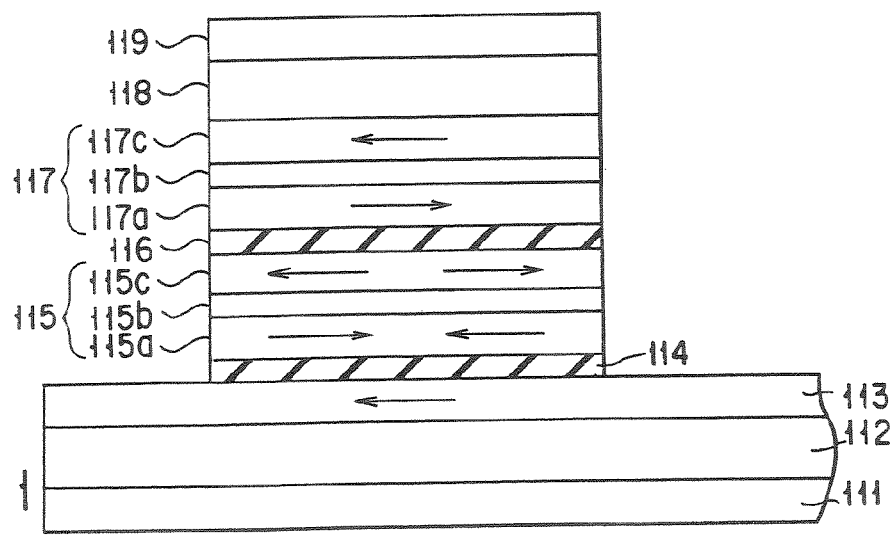
FIG. 11 shows a sectional view of a ferromagnetic double tunnel junction element used for still another MRAM of the present invention.

A ferromagnetic double tunnel junction element of FIG. 11 has a stacked structure of an underlayer 111/a first antiferromagnetic layer 112/a first magnetization pinned layer 113/a first dielectric layer 114/a magnetic recording layer 115 comprising a three-layered film of a ferromagnetic layer 115a, a nonmagnetic layer 115b and a ferromagnetic layer 115c/a second dielectric layer 116/a second magnetization pinned layer 117 comprising a three-layered film of a ferromagnetic layer 117a, a nonmagnetic layer 117b and a ferromagnetic layer 117c/a second antiferromagnetic layer 118/a protective layer 119.

The ferromagnetic layer 115a and the ferromagnetic layer 115c of the magnetic recording layer 115 are antiferromagnetically coupled. The ferromagnetic layer 117a and the ferromagnetic layer 117c of the second magnetization pinned layer 117 are anti-ferromagnetically coupled. The magnetization directions of the first magnetization pinned layer 113 in contact with the first dielectric layer 114, and the ferromagnetic layer 117a forming the second magnetization pinned layer 117 in contact with the second dielectric layer 116 are anti-parallel to each other.

In the above case, the length of the first magnetization pinned layer 113 may be preferably formed longer than those of the second magnetization pinned layer 117 and the magnetic recording layer 115 so as to form a part of a wire. In such a structure, the magnetic flux is confined in the second magnetization pinned layer 117 and the magnetic recording layer 115, and a leakage magnetic flux from the first magnetization pinned layer 113 formed longer has little influence, so that influence of stray field on the magnetic recording layer is reduced.

Figure 12:
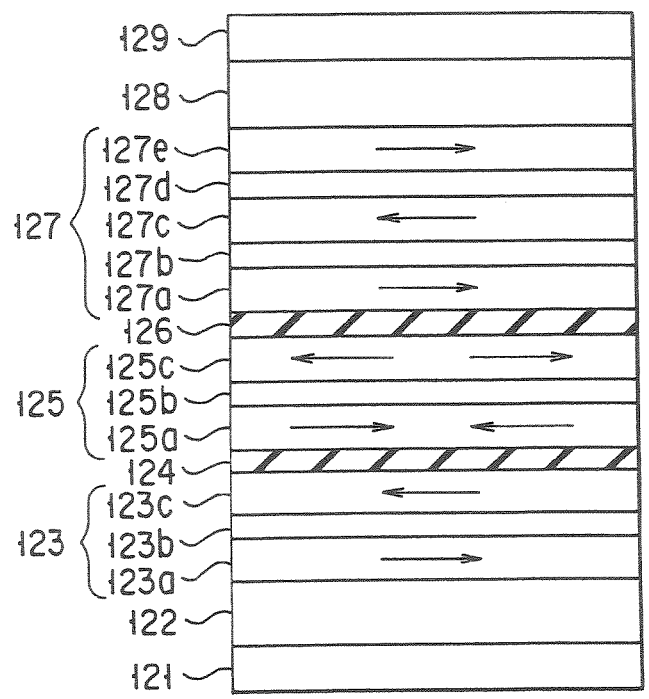
FIG. 12 shows a sectional view of a ferromagnetic double tunnel junction element used for still another MRAM of the present invention.

A ferromagnetic double tunnel junction element of FIG. 12 has a stacked structure of an underlayer 121/a first antiferromagnetic layer 122/a first magnetization pinned layer 123 comprising a three-layered film of a ferromagnetic layer 123a, a nonmagnetic layer 123b and a ferromagnetic layer 123c/a first dielectric layer 124/a magnetic recording layer 125 comprising a three-layered film of a ferromagnetic layer 125a, a nonmagnetic layer 125b and a ferromagnetic layer 125c/a second dielectric layer 126/a second magnetization pinned layer 127 comprising a five-layered film of a ferromagnetic layer 127a, a nonmagnetic layer 127b, a ferromagnetic layer 127c, nonmagnetic layer 127d and a ferromagnetic layer 127e/a second antiferromagnetic layer 128/a protective layer 129.

The ferromagnetic layer 125a and the ferromagnetic layer 125c of the magnetic recording layer 125 are antiferromagnetically coupled. The ferromagnetic layer 123a and the ferromagnetic layer 123c of the first magnetization pinned layer 123 are antiferromagnetically coupled. The ferromagnetic layer 127a, a ferromagnetic layer 127c, and a ferromagnetic layer 127e of the second magnetization pinned layer 127 are antiferromagnetically coupled. The magnetization directions of the ferromagnetic layer 123c forming the first magnetization pinned layer 123 in contact with the first dielectric layer 114, and the ferromagnetic layer 127a forming the second magnetization pinned layer 127 in contact with the second dielectric layer 126 are anti-parallel to each other. Also in this case, the length of the first magnetization pinned layer 123 may be preferably formed longer than those of the second magnetization pinned layer 117 and the magnetic recording layer 115.

Figure 13:
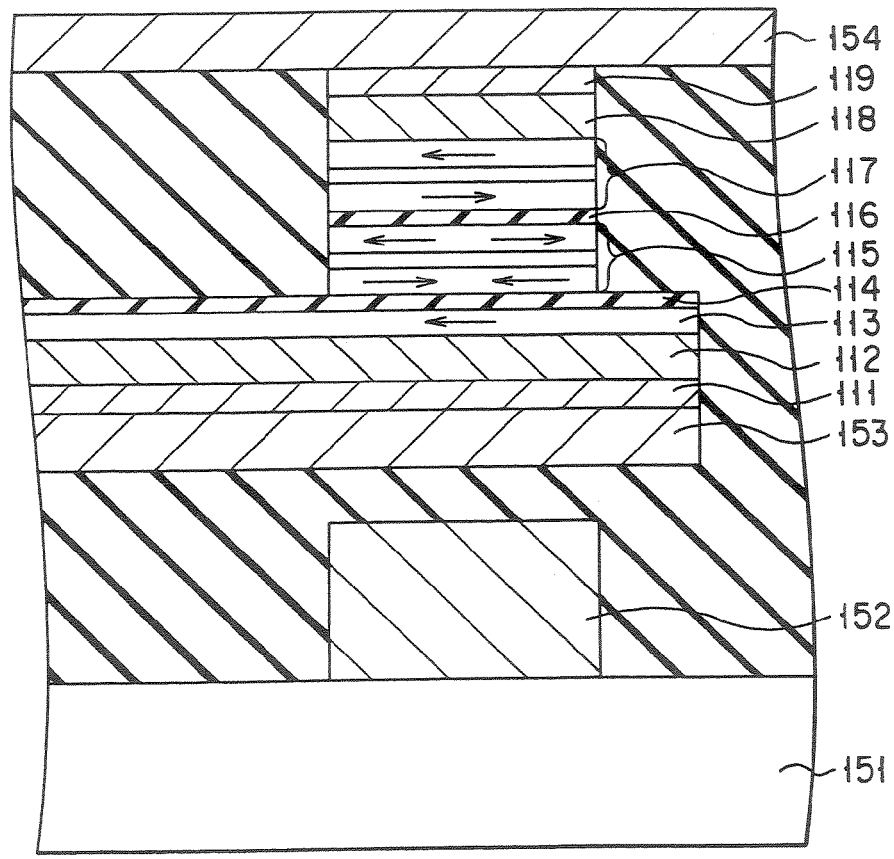
FIG. 13 shows a sectional view of an example of an MRAM according to the present invention.

FIG. 13 is a sectional view of the MRAM using the ferromagnetic double tunnel junction element of FIG. 11. A trench is formed in a $SiO_2$ insulator on a Si substrate 151, and a word line 152 comprising metal embedded in the trench is formed. A $SiO_2$ insulator is formed on the word line 152, on which metal wire 153 and a ferromagnetic double tunnel junction element (TMR element) are formed. As shown in FIG. 11, the TMR element has a stacked structure of an underlayer 111/a first antiferromagnetic layer 112/a first magnetization pinned layer 113/a dielectric layer 114/a magnetic recording layer 115 comprising a three-layered film of a ferromagnetic layer 115a, a nonmagnetic layer 115b and a ferromagnetic layer 115c/a second dielectric layer 116/a second magnetization pinned layer 117 comprising a three-layered film of a ferromagnetic layer 117a, a nonmagnetic layer 117b and a ferromagnetic layer 117c/a second antiferromagnetic layer 118/a protective layer 119. The TMR element is processed so as to have a predetermined junction area, and has a deposited interlayer insulation film at its periphery. A bit line 154 connected to the protective layer 119 of the TMR element is formed on the interlayer insulation film.

In this MRAM, a current magnet field is applied (for example, to a hard axis direction) to the magnetic recording layer 115 by flowing a current in the word line 152, and also a down-spin current is injected from the bit line 154 through layers to the magnetic recording layer 115 or an up-spin current is injected from the metal wire 153 through layers to the magnetic recording layer 115, thereby performing writing by reversing the magnetization direction of the magnetic recording layer 115. Thus, the writing by the injection of the spin current and the application of the current magnetic field to the magnetic recording layer 115 may cause reduction in the spin current flowing in the TMR element and in the current density flowing in the wire (word line). Therefore, even in an MRAM with a capacity of 1 Gb or more, it may be possible to control the wire melting or the destruction of the tunnel barrier layer (dielectric layer) of the TMR element and to improve reliability.

Figure 14:
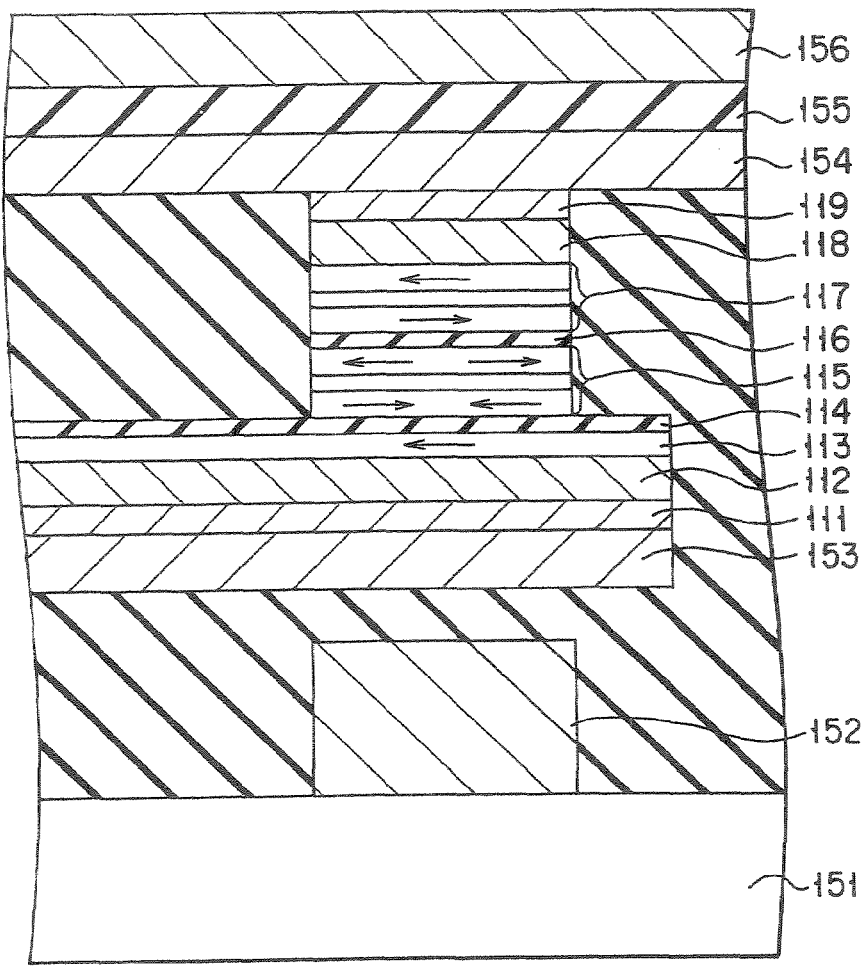
FIG. 14 shows a sectional view of another example of an MRAM according to the present invention.

In the MRAM of FIG. 13, the current flowing in the bit line 154 functions to apply a current magnetic field to the magnetic recording layer 115 in a different direction (for example, to an easy axis direction) from that of the word line 152. In order to increase the current magnetic field in this direction, to improve the controllability, and to reduce the spin current injected into the magnetic recording layer 115, the second word line 156 may be provided on the bit line 154 so as to extend in parallel with the bit line 154 with intervening the insulator layer 155 therebetween, as shown in FIG. 14. In the MRAM of FIG. 14, the reversal of the magnetization of the magnetic recording layer 115 may be repeated by a lower current, using the change in the direction of the current flowing in the TMR element and in the second word line 156 together.

Figure 15:
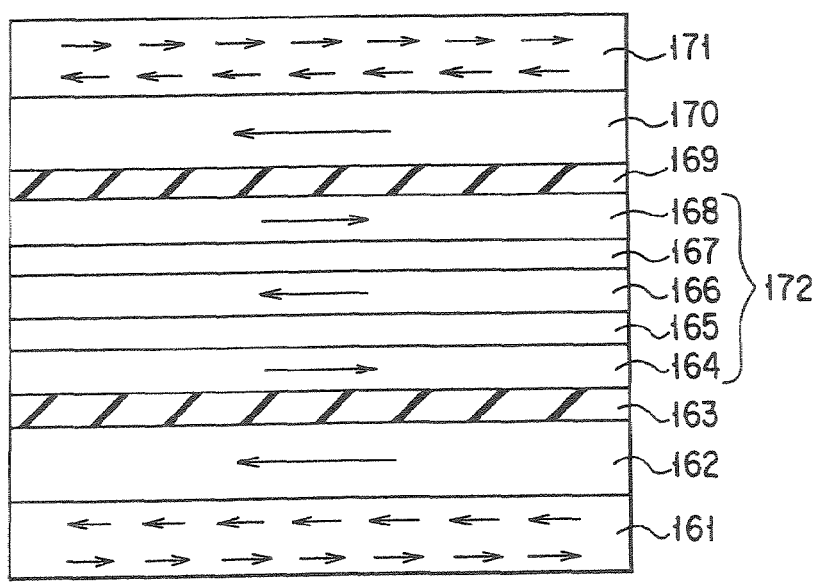
FIG. 15 shows a sectional view of another example of a magnetoresistive element according to the present invention.

FIG. 15 is a sectional view of another magnetoresistive element according to the present invention. The magnetoresistive element shown in FIG. 15 comprises a ferromagnetic double tunnel junction element having a stacked structure of a first antiferromagnetic layer 161, a first ferromagnetic layer 162, a first tunnel insulator 163, a second ferromagnetic layer 164, a first nonmagnetic layer 165, a third ferromagnetic layer 166, a second nonmagnetic layer 167, a fourth ferromagnetic layer 168, a second tunnel insulator 169, a fifth ferromagnetic layer 170, and a second antiferromagnetic layer 171.

A magnetic recording layer 172 comprises the second ferromagnetic layer 164, the first nonmagnetic layer 165, the third ferromagnetic layer 166, the second nonmagnetic layer 167 and the fourth ferromagnetic layer 168, sandwiched between the first tunnel insulator 163 and the second tunnel insulator 169. The second and third ferromagnetic layers 164 and 166 are antiferromagnetically coupled through the first nonmagnetic layer 165, and their magnetization directions are kept anti-parallel to each other. Similarly, the third and fourth ferromagnetic layers 166 and 168 are antiferromagnetically coupled through the second nonmagnetic layer 167, and their magnetization directions are kept anti-parallel to each other.

The first ferromagnetic layer 162 is exchange-coupled with the first antiferromagnetic layer 161, and has the pinned magnetization in the direction of the arrows shown in the drawing. Similarly, the fifth ferromagnetic layer 170 is exchange-coupled with the second antiferromagnetic layer 171 and has the pinned magnetization in the same magnetization direction as that of the first ferromagnetic layer 162.

In the magnetoresistive element, the magnetization rotation is performed in the direction of the external magnetic field, with keeping the antiferromagnetic coupling among the second to fourth ferromagnetic layer 164, 166, 168, when an external magnetic field is applied in a predetermined direction. On the other hand, the first ferromagnetic layer 162 and the fifth ferromagnetic layer 170 are pinned by exchange-coupling with the first and second antiferromagnetic layer 161, 171, so that they do not cause magnetization rotation in the external magnetic field allowing the magnetization rotation of the second to fourth ferromagnetic layer 164, 166, 168. Thus, logic "1" or logic "0" may be recorded on the second to fourth ferromagnetic layers 164, 166, 168.

At this time, there is no increased diamagnetic field in a scaled-down element, since the magnetic flux is confined between the second and third ferromagnetic layers 164 and 166 antiferromagnetically coupled through the first nonmagnetic layer 165, and the magnetic flux is confined between the third and fourth ferromagnetic layers 166 and 168 antiferromagnetically coupled through the second nonmagnetic layer 167. Therefore, the reversal magnetic field Hsw required for the magnetization reversal, hardly depending on the size of the memory cells, is determined by the magnetic coercive force Hc of the second to fourth ferromagnetic layers 164, 166 and 168. That is, there may be high energy conservation effect, since lower He may cause lower Hsw. Assuming that the uniaxial anisotropy is Ku, and the magnetization intensity is M, the magnetic coercive force He may be ideally given as Hc=2Ku/M. Thus, use of a material with the low uniaxial anisotropy may realize the object. Moreover, there may be obtained an advantage that the recording bits are stable to the disturbing magnetic field, since the magnetic flux is confined in the antiferromagnetically coupled second to fourth ferromagnetic layer 164, 166 and 168.

In the magnetoresistive element of FIG. 15, since three ferromagnetic layers are included in the magnetic recording layer 172, the second and fourth ferromagnetic layers 164 and 168 of the magnetic recording layer 172 have the same magnetization direction. In this case, the first ferromagnetic layer (magnetization pinned layer) 162 opposing to the second ferromagnetic layer 164 through the first tunnel insulator 163 and the fifth ferromagnetic layer (magnetization pinned layer) 170 opposing to the fourth ferromagnetic layer 168 through the second tunnel insulator 169, also, have the same magnetization direction. Thus, there may be more options for selection of the antiferromagnetic materials, since it suffices to merely use the same material as the first and second antiferromagnetic layers 161 and 171 and to make the magnetization directions of the first ferromagnetic layer 162 and that of the fifth ferromagnetic layer 170 to be identical.

It may be preferable that the magnetization value M3 of the third ferromagnetic layer 166 is equal to the total magnetization value M(2+4) of the magnetization value M2 of the second ferromagnetic layer 164 and the magnetization value M4 of the fourth ferromagnetic layer 168 in order to effectively confine the magnetic flux in the second to fourth ferromagnetic layers 164, 166 and 168. However, since magnetization rotation of the recording layer becomes difficult when M3 is equal to M(2+4), it may be preferable that the above magnetization values are slightly different from each other.

For example, when the second to fourth ferromagnetic layers are made of the same material, the thickness T3 of the third ferromagnetic layer 166 is made to be different from the total thickness T(2+4) of the second and fourth ferromagnetic layers 164 and 168. In this case, it may be preferable that the absolute value of the difference between T3 and T(2+4) is within a range from 0.5 nm to 5 nm.

It may be possible that the value of M3 is different from that of M(2+4) by using different materials for the second to fourth ferromagnetic layers 164, 166 and 168.

Moreover, it may be also possible that the value of M3 is different from that of M(2+4) by providing other ferromagnetic layer in contact with the second to fourth ferromagnetic layer 164, 166 and 168 which are antiferromagnetically coupled. A magnetoresistive element of FIG. 16 has a structure in which the ferromagnetic layer 168b is provided in contact with the fourth ferromagnetic layer 168 among the second to fourth ferromagnetic layers 164, 166 and 168 which are antiferromagnetically coupled through the first and second nonmagnetic layers 164 and 167. In this case, if a soft magnetic material such as permalloy, Fe, Co—Fe alloy and Co—Fe—Ni alloy is used as ferromagnetic layer 168b, it may be preferably possible to perform the magnetization rotation at a low magnetic field.

In the present invention, a magnetic layered film in which the two ferromagnetic layers 162a and 162c are antiferromagnetically coupled through the non-magnetic layer 162b may be used as the first ferromagnetic layer (magnetization pinned layer) 162, and a magnetic layered film in which the two ferromagnetic layers 170a and 170c are antiferromagnetically coupled through the non-magnetic layer 170b may be used as the fifth ferromagnetic layer (magnetization pinned layer) 170. In such a structure, the magnetizations of the first and fifth ferromagnetic layers 162 and 170 are more stably and firmly pinned. In addition, since a leakage magnetic field from the first and fifth ferromagnetic layers 162 and 170 becomes low, there may be controlled magnetic effects on the magnetic recording layer 172, so that recording stability is increased.

When memory cells each having the above magnetoresistive element and a transistor are arrayed, the MRAM shown in FIG. 6 may be formed. When memory cells each having the above magnetoresistive element and a diode are arrayed, the MRAM shown in FIG. 8 may be formed.

Half metal such as NiMnSb and $Co_2MnGe$ may be used for the material of the second to fourth ferromagnetic layers 164, 166 and 168, other than Co, Fe, Co—Fe alloy, Co—Ni alloy, Co—Fe—Ni alloy, and the like. A higher magnetoresistive effect may be obtained by the use of the half metal, since the half metal has an energy gap in a half of the spin bands, so that a higher reproduction output may be obtained.

Moreover, it may be preferable that the second to fourth ferromagnetic layers 164, 166 and 168 have weak uniaxial anisotropy in an in-plane direction. The uniaxial anisotropy which is too strong causes high magnetic coercive force of each ferromagnetic layer to cause unfavorable switching magnetic field. The intensity of the uniaxial anisotropy may be $10^6$ erg/cm$^3$ or less, preferably, $10^5$ erg/cm$^3$ or less. The thickness of each ferromagnetic layer maybe 1 to 10 nm.

Various kinds of metal such as Cu, Au, Ag, Cr, Ru, Ir, Al and their alloys may be used as materials for the first and second nonmagnetic layers 165 and 167 existing between the second to fourth ferromagnetic layers 164, 166 and 168, and causing antiferromagnetic coupling. In particular, Cu, Ru, and Ir may be preferable, since strong antiferromagnetic coupling may be obtained even with a thin thickness. The preferable range of the thickness of the nonmagnetic layers may be 0.5 to 2 nm.

As mentioned above, $Al_2O_3$, NiO, silicon oxide, MgO, and the like may be used as materials for the tunnel insulator. The preferable range of the thickness of the tunnel insulator may be 0.5 to 3 nm. As mentioned above, FeMn, IrMn, PtMn and the like may be used for the antiferromagnetic layers.

Then, a magnetoresistive head using the magnetoresistive element of the present invention will be described.

Figure 18:
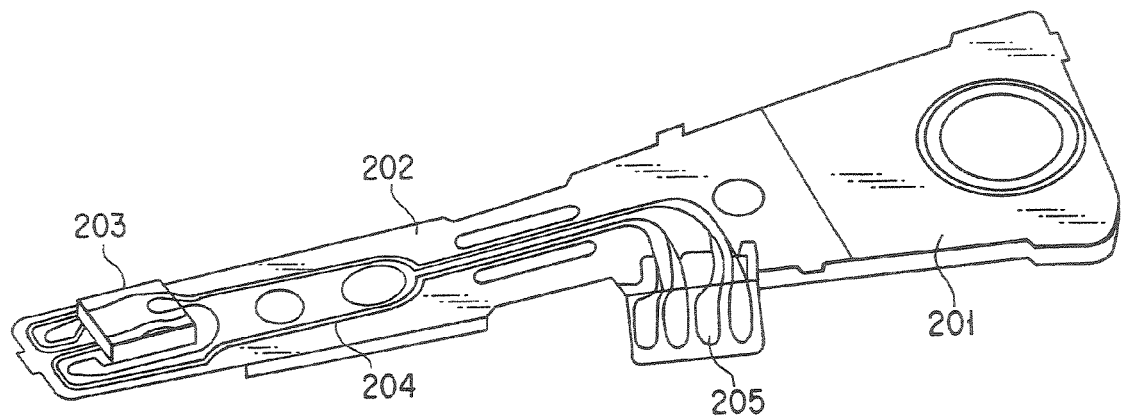
FIG. 18 shows a perspective view of a magnetic head assembly provided with a magnetoresistive head comprising a tunnel junction magnetoresistive element according to the present invention.

FIG. 18 is a perspective view of a magnetoresistive head assembly provided with a magnetoresistive head having a ferromagnetic double tunnel junction element according to the present invention. An actuator arm 201, being provided with a hole to fix it to a fixed axis in the magnetic disk apparatus, comprises a bobbin part holding a driving coil (not shown). A suspension 202 is fixed to one end of the actuator arm 201. A head slider 203 provided with the magnetoresistive head having ferromagnetic double tunnel junction element in each form mentioned above is installed at the tip of the suspension 202. Moreover, a lead wire 204 for reading and writing of signals is wired to the suspension 202; one end of the lead wire 204 is connected to each electrode of the magnetoresistive head installed in the head slider 203; and the other end of the lead wire 204 is connected to an electrode pad 205.

Figure 19:
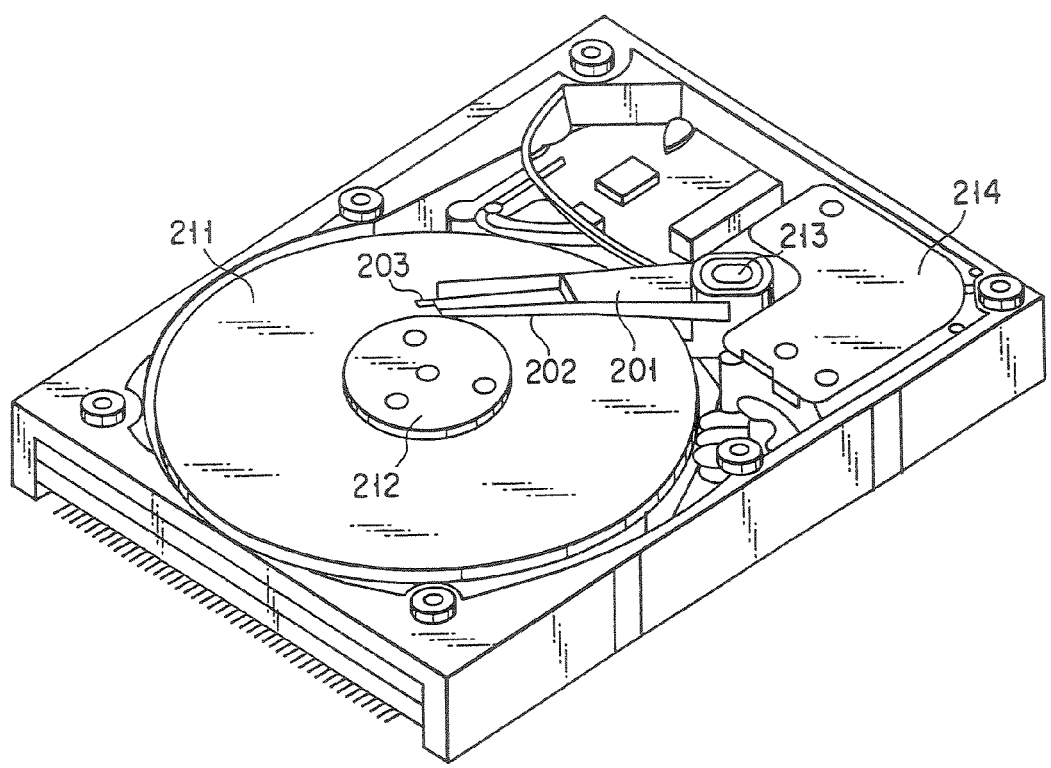
FIG. 19 shows a perspective view of the internal structure of a magnetic disk apparatus provided with the magnetic head assembly shown in FIG. 18.

FIG. 19 is a perspective view of the internal structure of a magnetic disk apparatus provided with the magnetic head assembly shown in FIG. 18. A magnetic disk 211 is fixed to a spindle 212, and rotated by a motor (not shown) in response to control signals from a driving control part (not shown). The actuator arm 201 of FIG. 18 is fixed to a fixed axis 213, and supports the suspension 202 and the head slider 203 at the tip of the suspension. When the magnetic disk 211 is rotated, the air-bearing surface of the had slider 203 opposing to the disk is kept in a glided state from the surface of the disk 211 by a predetermined flying height to perform recording and reproducing of information. A voice coil motor 214, a kind of a linear motor, is installed at the proximal end of the actuator arm 201. The voice coil motor 214 is constituted by a driving coil (not shown) wound up around the bobbin part of the actuator arm 201, and a magnetic circuit having a permanent magnet arranged opposing to and surrounding the coil and a yoke. The actuator arm 201 is supported by ball bearings (not shown) provided at two positions of the upper and lower ends of the fixed axis 213, and can perform sliding motion by the action of the voice coil motor 214.

The first, second and fourth ferromagnetic double tunnel junction elements (FIGS. 1, 2 and 4) may be preferably used, and the first ferromagnetic double tunnel junction element may be more preferably used for application of the magnetoresistive head. Moreover, the spins of the adjoining pinned layer and free layers are preferably perpendicular to each other by deposition or heat treatment in the magnetic field for use of the magnetoresistive head. A linear response may be obtained for the leakage magnetic field from the magnetic disk with the above structure to have applications to any type of head structures.

EMBODIMENTS

The embodiments of the present invention will be described hereinafter.

Embodiment 1

An embodiment, where two kinds of ferromagnetic double tunnel junction elements (sample A, and B) with the structure shown in FIG. 1 were formed on a Si/SiO$_2$ substrate or SiO$_2$ substrate, will be described below.

The sample A has a structure sequentially stacked with a TaN underlayer, a first antiferromagnetic layer of a two-layered film of Fe—Mn Ni—Mn, a first ferromagnetic layer of CoFe, a first dielectric layer of Al$_2$O$_3$, a second ferromagnetic layer of Co$_9$Fe, a second dielectric layer of Al$_2$O$_3$, a third ferromagnetic layer of CoFe, a second antiferromagnetic layer of a two-layered film of Ni—Fe/Fe—Mn, and a protective layer of Ta.

The sample B has a structure sequentially stacked with a TaN underlayer, a first antiferromagnetic layer of Ir—Mn, a first ferromagnetic layer of Co—Fe, a first dielectric layer of Al$_2$O$_3$, a second ferromagnetic layer of a three-layered film of CoFe/Ni—Fe/CoFe, a second dielectric layer of Al$_2$O$_3$, a third ferromagnetic layer of CoFe, a second antiferromagnetic layer of Ir—Mn, and a protective layer of Ta.

The sample A was made as follows. The substrate was put into a sputtering apparatus. After setting the initial pressure at $1\times10^{-7}$ Torr, Ar was introduced into the apparatus and the pressure was set at a predetermined value. Then, layers of Ta (5 nm)/$Fe_{54}Mn_{46}$ (20 nm)/$Ni_8Fe_2$ (5 nm)/CoFe (3 nm)/$Al_2O_3$ (1.7 nm)/$Co_9Fe$ (3 nm)/$Al_2O_3$ (2 nm)/CoFe (3 nm)/$Ni_8Fe_2$ (5 nm)/$Fe_{54}Mn_{46}$ (20 nm)/Ta (5 nm) were sequentially stacked on the substrate. Here, the $Al_2O_3$ layer was formed by depositing Al using an Al target in pure Ar gas, by introducing oxygen into the apparatus without breaking the vacuum, and then by exposing it to the plasma oxygen.

After deposition of the above stacked film, a first resist pattern defining a lower wire shape with a width of 100 μm was formed on the uppermost Ta protective layer by photolithography, and the above film was processed by ion milling.

Next, after removal of the first resist pattern, a second resist pattern defining a junction dimensions was formed on the uppermost Ta protective layer by photolithography, and the layers of $Co_9Fe/Al_2O_3$/CoFe Ni—Fe/—Mn/Ta above the first $Al_2O_3$ layer were processed by ion milling. The $Al_2O_3$ layer with a thickness of 300 nm was deposited by electron beam evaporation, while leaving the second resist pattern, and then the second resist pattern and the $Al_2O_3$ layer on the above pattern were lifted off, thereby an interlayer insulation film was formed in regions except the junction region.

Then, after forming the third resist pattern covering regions except the region of the electrode wire, the surface was reverse-sputtered and cleaned. After Al was deposited allover the surface, the third resist pattern and the Al on the pattern were lifted off, thereby the Al electrode wire was formed. Then, after introduction into a heat-treating furnace in the magnetic field, the uniaxial anisotropy was introduced to the pinned layer.

The sample B was made as follows. The substrate was put into a sputtering apparatus. After setting the initial pressure at $1\times10^{-7}$ Torr, Ar was introduced into the apparatus and the pressure was set at a predetermined value. Then, layers of Ta (5 nm)/$Ir_{22}Mn_{78}$ (20 nm)/CoFe (3 nm)/$Al_2O_3$ (1.5 nm)/CoFe (1 nm)/$Ni_8Fe_2$(t nm, t=1, 2, or 3 nm)/CoFe (1 nm)/$Al_2O_3$ (1.8 nm)/CoFe (3 nm)/$Ir_{22}Mn_{78}$ (20 nm)/Ta (5 nm) were sequentially stacked on the substrate. Here, the $Al_2O_3$ layer was formed in a similar manner to the above method.

After deposition of the above stacked film, a first resist pattern defining a lower wire shape with a width of 100 μm was formed on the uppermost Ta protective layer by photolithography, and the above film was processed by ion milling. Next, after removal of the first resist pattern, a second resist pattern defining a junction dimensions was formed on the uppermost Ta protective layer by photolithography, and the layers of CoFe/$Ni_8Fe_2$/CoFe/$Al_2O_3$/CoFe/$Ir_{22}Mn_{78}$/Ta above the first $Al_2O_3$ layer were processed by ion milling. Then, in a similar manner to the above, the formation of the $Al_2O_3$ interlayer insulation film, and that of the Al electrode wire, and the introduction of the uniaxial anisotropy to the pinned layer were performed.

For comparison, samples C and D described in the following were made.

The sample C is a ferromagnetic single tunnel junction element, and has a stacked structure of Ta/Ir—Mn/CoFe/$Al_2O_3$/CoFe/Ni—Fe/Ta.

The sample D is a ferromagnetic double tunnel junction element without an antiferromagnetic layer, and has a stacked structure of Ta (5 nm)/CoPt (20 nm)/$Al_2O_3$ (1.5 nm)/CoFe (1 nm)/$Ni_8Fe_2$ (3 nm)/CoFe (1 nm)/$Al_2O_3$ (1.8 nm)/CoPt (20 nm)/Ta (5 nm).

Figure 20:
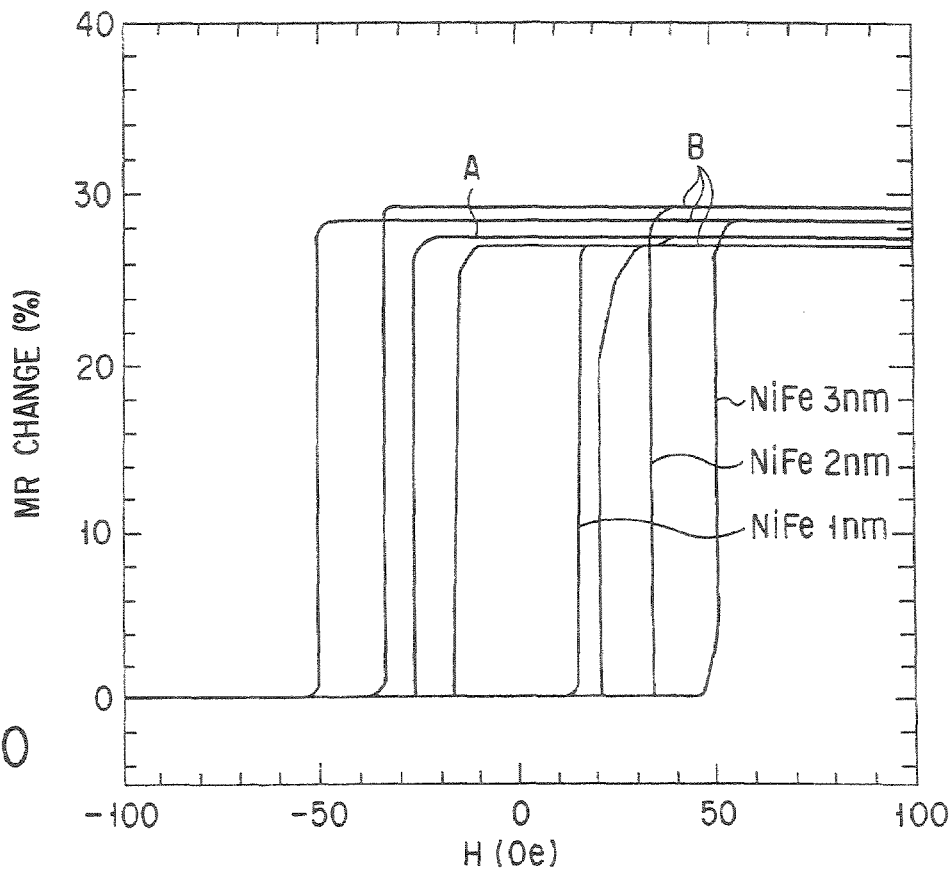
FIG. 20 shows a graph of magnetoresistive curves of the samples A and B in Embodiment 1.

The magnetoresistive curves of the samples A and B are shown in FIG. 20. For the sample A, 27% of an MR change was obtained by a low magnetic field of 25 Oe. For the sample B, it is understood that the reversal magnetic field may be controlled by changing the thickness ratio between the $Ni_8Fe_2$ and CoFe layers in the free layer (magnetic recording layer). That is, when the thickness of the $Ni_8Fe_2$ layer is 1 nm, 2 nm and 3 nm, the resistance is largely changed by a low magnetic field of 16 Oe, 36 Oe, and 52 Oe, respectively, to obtain a high MR change of 26% or more.

Figure 21:
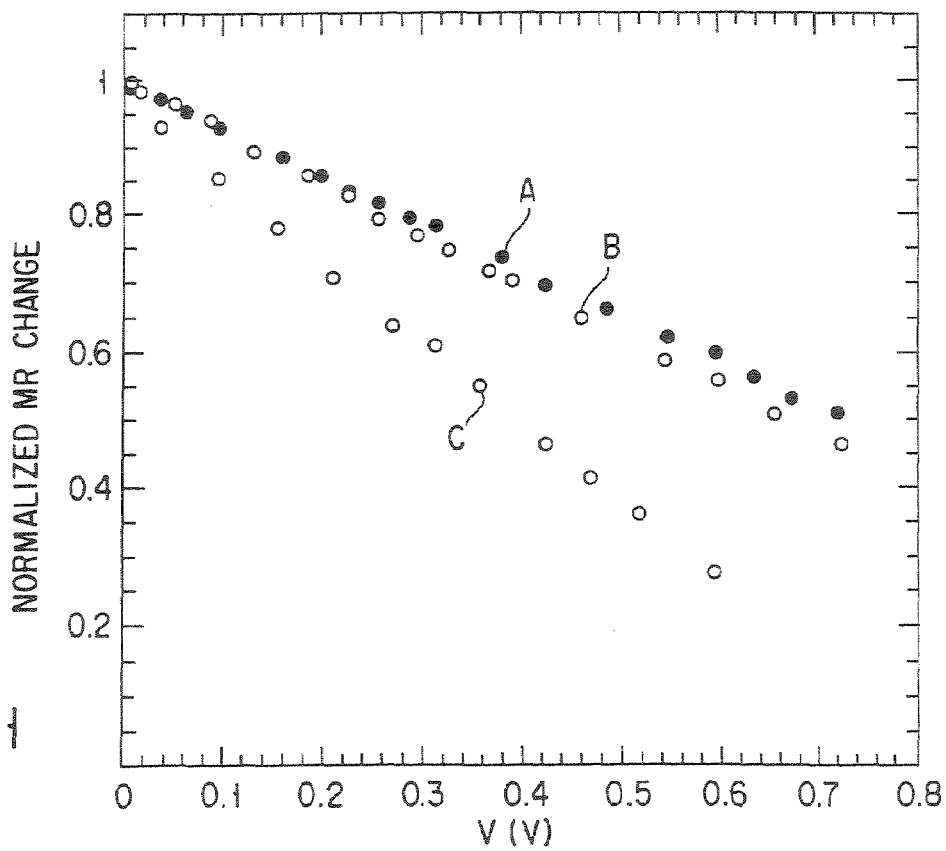
FIG. 21 shows a graph of applied voltage dependency of MR change for the samples A, B and C in Embodiment 1.

FIG. 21 shows applied voltage dependency of the MR change for the samples A, B and C. Here, the MR change normalized by the value at 0V is shown in the drawing. The drawing exhibits that the samples A and B have a higher voltage of $V_{1/2}$ at which the MR change is reduced to half, and a lower reduction in the MR change with increased voltage, compared to the sample C.

Figure 22:
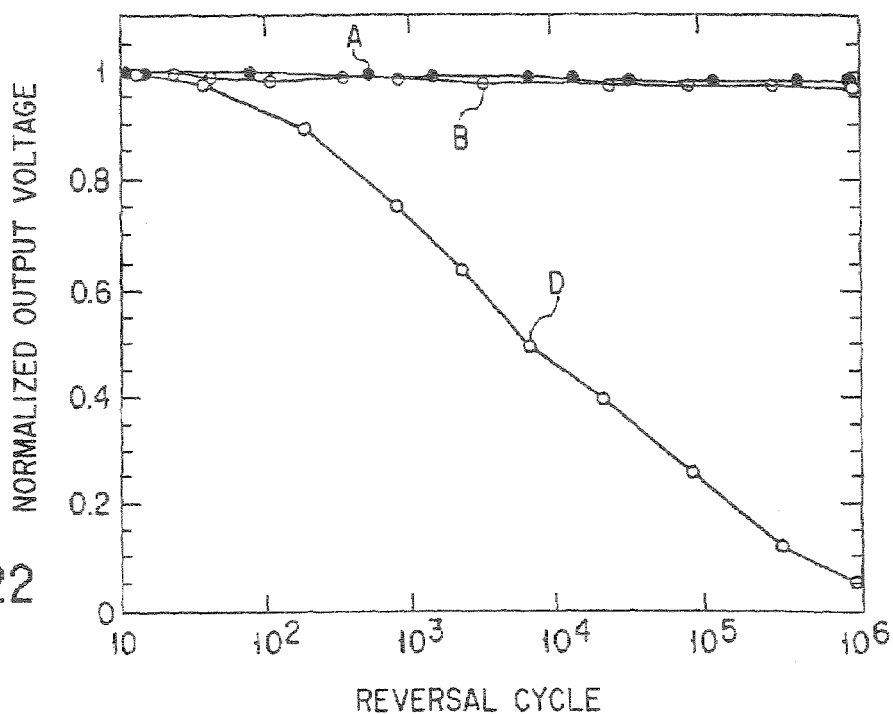
FIG. 22 shows a graph of relationships between reversal cycles of pulsed magnetic field and an output voltage for the samples A, B and D in Embodiment 1.

Next, the samples A, B and D were put in a solenoid coil, and fatigue tests of the magnetization pinned layer in a magnetically recorded state were conducted in a pulse magnetic field of 70 Oe. FIG. 22 shows the relationships between the reversal cycles and the output voltage of the pulse magnetic field for the sample A, B and D. In the drawing, the output voltage is normalized by an initial output voltage value. As clearly shown in the drawing, the output voltage is remarkably reduced with increase in the reversal cycles of the pulse magnetic field, in the case of the sample D. On the other hand, there is found no fatigue in the magnetization pinned layer in a magnetically recorded state in the case of the samples A and B.

It is evident from the above that the ferromagnetic double tunnel junction element having a structure shown in FIG. 1 shows suitable characteristics for applications to a magnetic memory device and a magnetic head.

When $SiO_2$, AlN, MgO, $LaAlO_3$, or $CaF_2$ was used for the dielectric layer, the similar tendency to the above was found.

Embodiment 2

An embodiment, where two kinds of ferromagnetic double tunnel junction elements (sample A2, and B2) with the structure shown in FIG. 2 were formed on a Si/$SiO_2$ substrate or $SiO_2$ substrate, will be described below.

The sample A2 has a structure sequentially stacked with a TaN underlayer, a first ferromagnetic layer of a two-layered film of Ni—Fe/CoFe, a first dielectric layer of $Al_2O_3$, a second ferromagnetic layer of CoFe, an antiferromagnetic layer of Ir—Mn, a third ferromagnetic layer of CoFe, a second dielectric layer of $Al_2O_3$, a fourth ferromagnetic layer of a two-layered film of CoFe/Ni—Fe, and a protective layer of Ta.

The sample B2 has a structure sequentially stacked with a TaN underlayer, a first ferromagnetic layer of a three-layered film of Ni—Fe/Ru/CoFe, a first dielectric layer of $Al_2O_3$, a second ferromagnetic layer of a two-layered film of CoFe/Ni—Fe, a first antiferromagnetic layer of Fe—Mn, a third ferromagnetic layer of a two-stacked film of Ni—Fe/CoFe, a second dielectric layer of $Al_2O_3$, a fourth ferromagnetic layer of CoFe/Ru/Ni—Fe, and a protective layer of Ta.

The sample A2 was made as follows. The substrate was put into a sputtering apparatus. After setting the initial pressure at $1\times10^{-7}$ Torr, Ar was introduced into the apparatus and the pressure was set at a predetermined value. Then, layers of Ta (3 nm)/$Ni_{81}Fe_{19}$ (t nm, t=3, 5, or 8 nm)/CoFe (1 nm)/$Al_2O_3$ (1.2 nm)/CoFe (1 nm)/$Ir_{22}Mn_{78}$ (17 nm)/CoFe (1 nm)/$Al_2O_3$ (1.6 nm)/CoFe (1 nm)/$Ni_{81}Fe_{19}$ (t nm, t=3, 5, or 8 nm)/Ta (5 nm) were sequentially stacked on the substrate. Here, the $Al_2O_3$ layer was formed by depositing Al using an Al target in pure Ar gas, by introducing oxygen into the apparatus without breaking the vacuum, and then by exposing it to the plasma oxygen.

After deposition of the above stacked film, a first resist pattern defining a lower wire shape with a width of 100 μm was formed on the uppermost Ta protective layer by photolithography, and the above film was processed by ion milling.

Next, after removal of the first resist pattern, a second resist pattern defining a junction dimensions was formed on the uppermost Ta protective layer by photolithography, and the layers of CoFe/Ir—Mn/CoFe/Al$_2$O$_3$/CoFe/Ni—Fe/Ta above the first Al$_2$O$_3$ layer were processed. The Al$_2$O$_3$ layer with a thickness of 300 nm was deposited by electron beam evaporation, while leaving the second resist pattern, and then the second resist pattern and the Al$_2$O$_3$ layer on the above pattern were lifted off, thereby an interlayer insulation film was formed in regions except the junction region.

Then, after forming the third resist pattern covering regions: except the region of the electrode wire, the surface was reverse-spattered and cleaned. After Al was deposited allover the surface, the third resist pattern and the Al on the pattern were lifted off, thereby the Al electrode wire was formed. Then, after introduction into a heat-treating furnace in the magnetic field, the uniaxial anisotropy was introduced to the pinned layer.

The sample B2 was made as follows. The substrate was put into a sputtering apparatus. After setting the initial pressure at 1×10$^{-7}$ Torr, Ar was introduced into the apparatus and the pressure was set at a predetermined value. Then, layers of Ta (2 nm)/Ni$_{81}$Fe$_{19}$ (6 nm)/Ru (0.7 nm)/Co$_4$Fe$_6$ (3 nm)/Al$_2$O$_3$ (1.5 nm)/CoFe (1 nm)/Ni$_{81}$Fe$_{19}$ (1 nm)/Fe$_{54}$Mn$_{46}$ (20 nm)/Ni$_{81}$Fe$_{19}$ (1 nm)/CoFe (1 nm)/Al$_2$O$_3$ (1.7 nm)/Co$_4$Fe$_6$ (3 nm)/Ru (0.7 nm)/Ni$_{81}$Fe$_{19}$ (6 nm)/Ta (5 nm) were sequentially stacked on the substrate. Here, the Al$_2$O$_3$ layer was formed in a similar manner to the above method.

After deposition of the above stacked film, a first resist pattern defining a lower wire shape with a width of 100 μm was formed on the uppermost Ta protective layer by photolithography, and the above film was processed by ion milling. Next, after removal of the first resist pattern, a second resist pattern defining a junction dimensions was formed on the uppermost Ta protective layer by photolithography, and the layers of CoFe/N$_{81}$Fe$_{19}$/Fe$_{54}$Mn$_{46}$/Ni$_{81}$Fe$_{19}$/CoFe/Al$_2$O$_3$/Co$_4$Fe$_6$/Ru/N$_{81}$Fe$_{19}$/Ta above the first Al$_2$O$_3$ layer were processed by ion milling. Then, in a similar manner to the above, the formation of the Al$_2$O$_3$ interlayer insulation film, and that of the Al electrode wire, and the introduction of the uniaxial anisotropy to the pinned layer were performed.

For comparison, samples C2 and D2 described in the following were made.

The sample C2 is a ferromagnetic single tunnel junction element, and has a stacked structure of Ta (3 nm)/Ni$_{81}$Fe$_{19}$ (5 nm)/CoFe (1 nm)/Al$_2$O$_3$ (1.2 nm)/CoFe (1 nm)/Ir$_{22}$Mn$_{78}$ (17 nm)/CoFe (1 nm)/Ta (5 nm).

The sample D2 is a ferromagnetic double tunnel junction element without an antiferromagnetic layer, and has a stacked structure of Ta (3 nm)/Ni$_{81}$Fe$_{19}$ (5 nm)/CoFe (1 nm)/Al$_2$O$_3$ (1.2 nm)/CoFe (1 nm)/Al$_2$O$_3$ (1.6 nm)/CoFe (1 nm)/Ni$_{81}$Fe$_{19}$ (5 nm)/Ta (5 nm).

Figure 23:
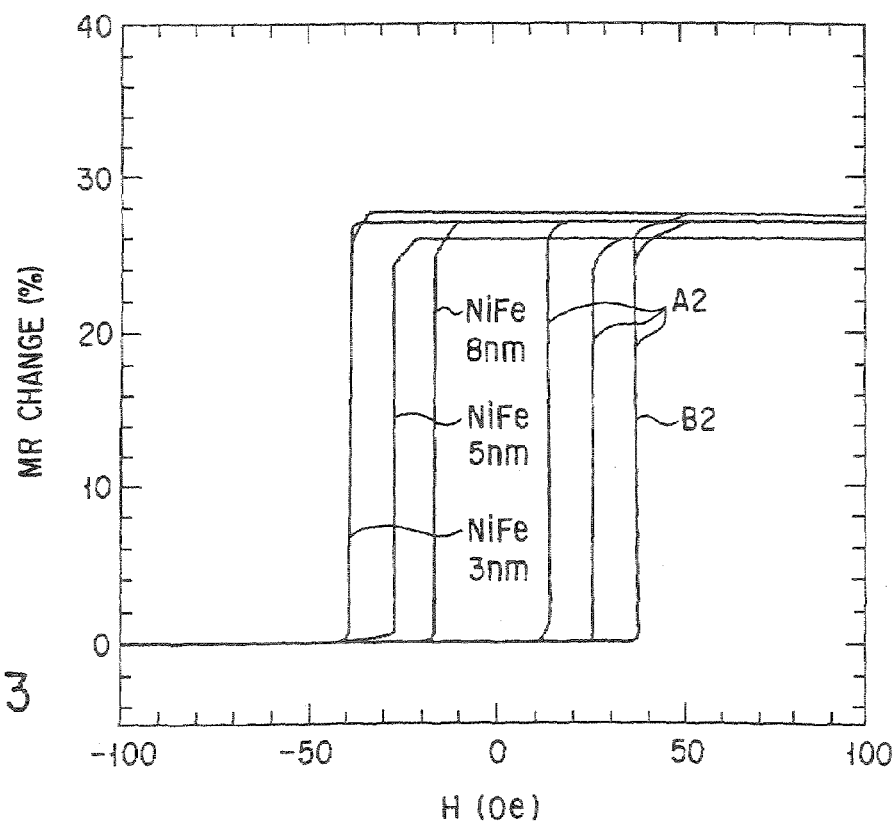
FIG. 23 shows a graph of magnetoresistive curves of the samples A2 and B2 in Embodiment 2.

The magnetoresistive curves of the samples A2 and B2 are shown in FIG. 23. For the sample A2, it is understood that the reversal magnetic field may be controlled by changing the thickness ratio between the Ni$_8$Fe$_2$ and CoFe layers in the free layer (magnetic recording layer). That is, when the thickness of the Ni$_8$Fe$_2$ layer is 3 nm, 5 nm and 8 nm, the resistance is largely changed by a low magnetic field of 15 Oe, 26 Oe and 38 Oe, respectively, to obtain a high MR change of 26% or more. In the case of the sample B2, the MR change of 26% is obtained by a low magnetic field of 39 Oe.

Figure 24:
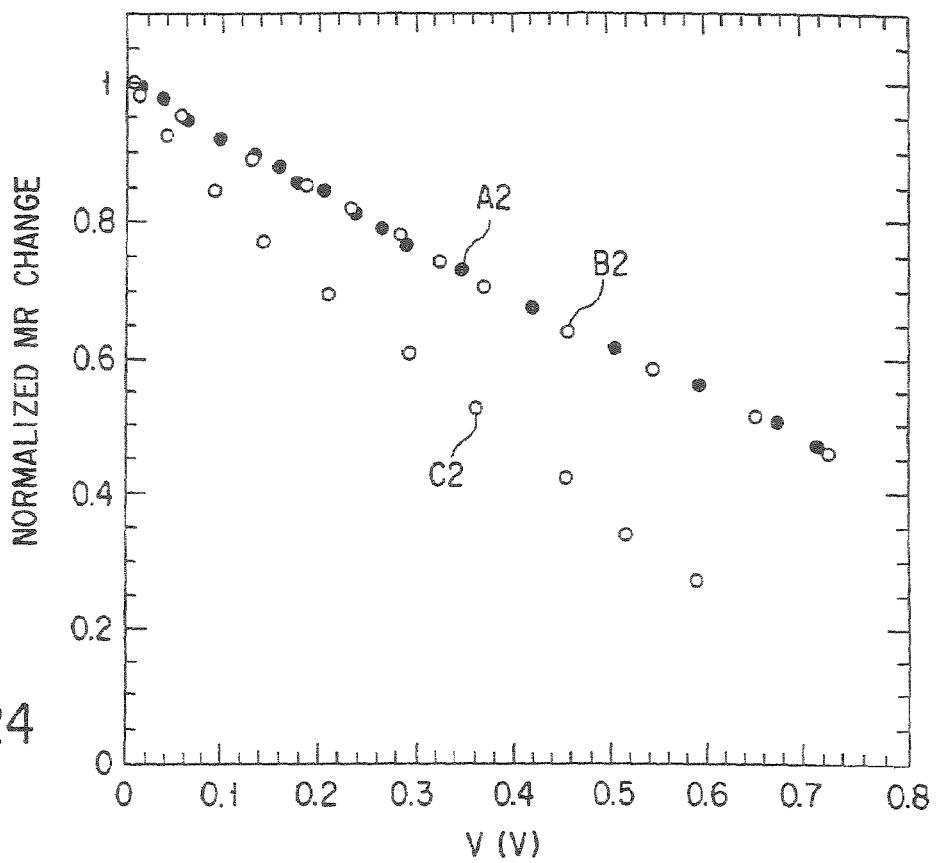
FIG. 24 shows a graph of applied voltage dependency of MR change for the samples A2, B2 and C2 in Embodiment 2.

FIG. 24 shows applied voltage dependency of the MR change for the samples A2, B2 and C2. Here, the MR change normalized by the value at 0V is shown in the drawing. The drawing exhibits that the samples A2 and B2 have a higher voltage of V$_{1/2}$ at which the MR change is reduced to half, and a lower reduction in the MR change with increased voltage, compared to the sample C2.

Figure 25:
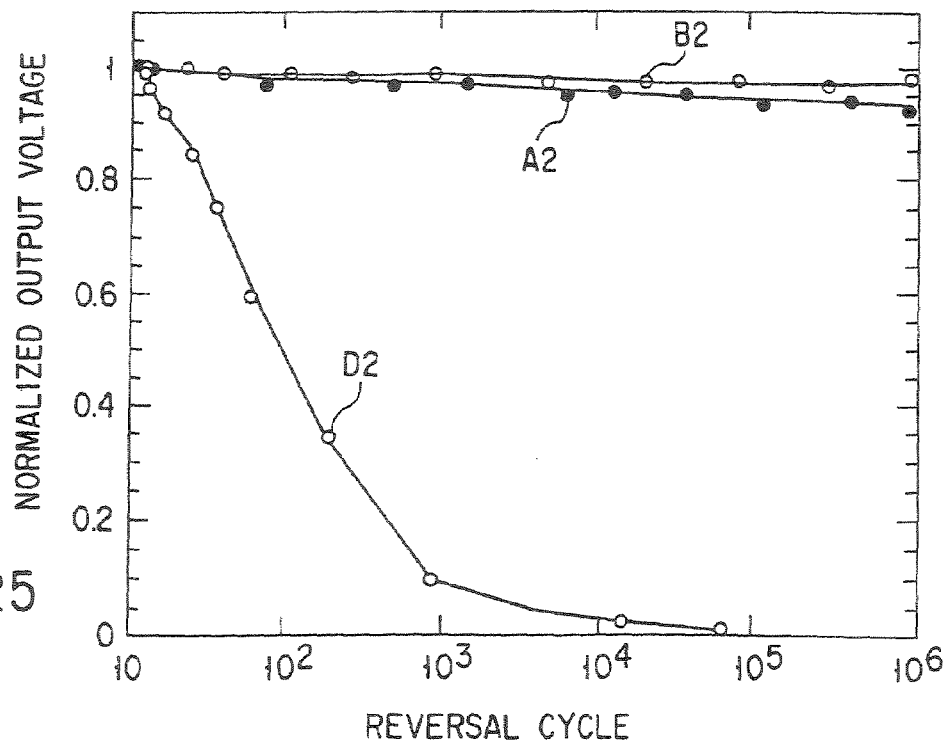
FIG. 25 shows a graph of relationships between reversal cycles of pulsed magnetic field and an output voltage for the samples A2, B2 and D2 in Embodiment 2.

Next, the samples A2, B2 and D2 were put in a solenoid coil, and fatigue tests of the magnetization pinned layer in a magnetically recorded state were conducted in a pulse magnetic field of 70 Oe. FIG. 25 shows relationships between the reversal cycles and the output voltage of the pulse magnetic field for the sample A2, B2 and D2. As clearly shown in the drawing, the output voltage is remarkably reduced with increase in the reversal cycles of the pulse magnetic field, in the case of the sample D2. On the other hand, there is found no fatigue in the magnetization pinned layer in a magnetically recorded state in the case of the samples A2 and B2. Moreover, in comparison between the samples A2 and B2, there is found less fatigue in the if sample B2 using an antiferromagnetically coupled three-layered structure of Co$_4$Fe$_6$/Ru/Ni$_{81}$Fe$_{19}$ for the free layer.

It is evident from the above that the ferromagnetic double tunnel junction element having a structure shown in FIG. 2 shows suitable characteristics for applications to a magnetic memory device and a magnetic head.

When SiO$_2$, AlN, MgO, LaAlO$_3$, or CaF$_2$ was used for the dielectric layer, the similar tendency to the above was found.

Embodiment 3

An embodiment, where two kinds of ferromagnetic double tunnel junction elements (sample A3, and B3) with the structure shown in FIG. 3 were formed on a Si/SiO$_2$ substrate or SiO$_2$ substrate, will be described below.

The sample A3 has a structure sequentially stacked with a TaN underlayer, a first antiferromagnetic layer of Ir—Mn, a first ferromagnetic layer of Co—Fe, a first dielectric layer of Al$_2$O$_3$, a second ferromagnetic layer of Co—Fe—Ni, a second antiferromagnetic layer of Fe—Mn, a third ferromagnetic layer of Co—Fe—Ni, a second dielectric layer of Al$_2$O$_3$, a fourth ferromagnetic layer of Co—Fe, an third antiferromagnetic layer of Ir—Mn, and a protective layer of Ta.

The sample B3 has a structure sequentially stacked with a TaN underlayer, a first antiferromagnetic layer of Ir—Mn, a first ferromagnetic layer of a three-layered film of Co—Fe/Ru/Co—Fe, a first dielectric layer of Al$_2$O$_3$, a second ferromagnetic layer of a two-layered film of CoFe/Ni—Fe, a second antiferromagnetic layer of Fe—Mn, a third ferromagnetic layer of a two-layered film of Ni—Fe/CoFe, a second dielectric layer of Al$_2$O$_3$, a fourth ferromagnetic layer of a three-layered film of Co—Fe/Ru/Coi-Fe, a third antiferromagnetic layer of Ir—Mn, and a protective layer of Ta.

The sample A3 was made as follows. The substrate was put into a sputtering apparatus. After setting the initial pressure at 1×10$^{-7}$ Torr, Ar was introduced into the apparatus and the pressure was set at a predetermined value. Then, layers of Ta (5 nm)/Ir$_{22}$Mn$_{78}$ (18 nm)/CoFe (2 nm)/Al$_2$O$_3$ (1.7 nm)/Co$_5$Fe$_1$Ni$_4$ (2 nm)/Fe$_1$Mn$_1$ (17 nm)/Co$_5$Fe$_1$Ni$_4$ (2 nm)/Al$_2$O$_3$ (2 nm)/CoFe (2 nm)/Ir$_{22}$Mn$_{78}$ (18 nm)/Ta (5 nm) were sequentially stacked on the substrate. Here, the Al$_2$O$_3$ layer was formed by depositing Al using an Al target in pure Ar gas, by introducing oxygen into the apparatus without breaking the vacuum, and then by exposing it to the plasma oxygen.

After deposition of the above stacked film, a first resist pattern defining a lower wire shape with a width of 100 μm was formed on the uppermost Ta protective layer by photolithography, and the above film was processed by ion milling.

Next, after removal of the first resist pattern, a second resist pattern defining a junction dimensions was formed on the uppermost Ta protective layer by photolithography, and the layers of $Co_5Fe_1Ni_4/Fe_1Mn_1/CoFeNi_4/Al_2O_3/CoFe/Ir_{22}Mn_{78}/Ta$ above the first $Al_2O_3$ layer were processed by ion milling. The $Al_2O_3$ layer with a thickness of 350 nm was deposited by electron beam evaporation, while leaving the second resist pattern, and then the second resist pattern and the $Al_2O_3$ layer on the above pattern were lifted off, thereby an interlayer insulation film was formed in regions except the junction region.

Then, after forming the third resist pattern covering regions except the region of the electrode wire, the surface was reverse-spattered and cleaned. After Al was deposited allover the surface, the third resist pattern and the Al on the pattern were lifted off, thereby the Al electrode wire was formed. Then, after introduction into a heat-treating furnace in the magnetic field, the uniaxial anisotropy was introduced to the pinned layer.

The sample B3 was made as follows. The substrate was put into a sputtering apparatus. After setting the initial pressure at $1 \times 10^{-7}$ Torr, Ar was introduced into the apparatus and the pressure was set at a predetermined value. Then, layers of Ta (3 nm)/Ir—Mn (14 nm)/Co—Fe (1.5 nm)/Ru (0.7 nm)/Co—Fe (1.5 nm)/$Al_2O_3$ (1.7 nm)/CoFe (1 nm)/$Ni_{81}Fe_{19}$ (2 nm)/$Fe_{45}Mn_{55}$ (19 nm)/$Ni_{81}Fe_{19}$ (2 nm)/CoFe (1 nm)/$Al_2O_3$ (2.1 nm)/$Co_9Fe$ (2 nm)/Ru (0.8 nm)/$Co_9Fe$ (2 nm)/Ir—Mn (14 nm)/Ta (5 nm) were sequentially stacked on the substrate. Here, the $Al_2O_3$ layer was formed in a similar manner to the above method.

After deposition of the above stacked film, a first resist pattern defining a lower wire shape with a width of 100 μm was formed on the uppermost Ta protective layer by photolithography, and the above film was processed by ion milling. Next, after removal of the first resist pattern, a second resist pattern defining a junction dimensions was formed on the uppermost Ta protective layer by photolithography, and the layers of $CoFe/Ni_{81}Fe_{19}/Fe_{45}Mn_{55}/Ni_{81}Fe_{19}/CoFe/Al_2O_3/Co_9Fe/Ru/Co_9Fe/Ir$—Mn/Ta above the first $Al_2O_3$ layer were processed by ion milling. Then, in a similar manner to the above, the formation of the $Al_2O_3$ interlayer insulation film, and that of the Al electrode wire, and the introduction of the uniaxial anisotropy to the pinned layer were performed.

For comparison, samples C3 and D3 described in the following were made.

The sample C3 is a ferromagnetic single tunnel junction element, and has a stacked structure of Ta (3 nm)/Ir—Mn (14 nm)/Co—Fe (1.5 nm)/Ru (0.7 nm)/Co- FE (1.5 nm)/$Al_2O_3$ (1.7 nm)/CoFe (1 nm)/$Ni_{81}Fe_{19}$ (2 nm) $Fe_{45}Mn_{55}$ (19 nm)/Ta (5 nm).

The sample D3 is a ferromagnetic double tunnel junction element without an antiferromagnetic layer, and has a stacked structure of Ta (5 nm)/$Co_8Pt_2$(15 nm)/CoFe (2 nm)/$Al_2O_3$ (1.7 nm)/$Co_5Fe_1Ni_4$ (2 nm)/$Al_2O_3$ (2 nm)/CoFe (2 nm)/$Co_8Pt_2$(15 nm)/Ta (5 nm).

Figure 26:
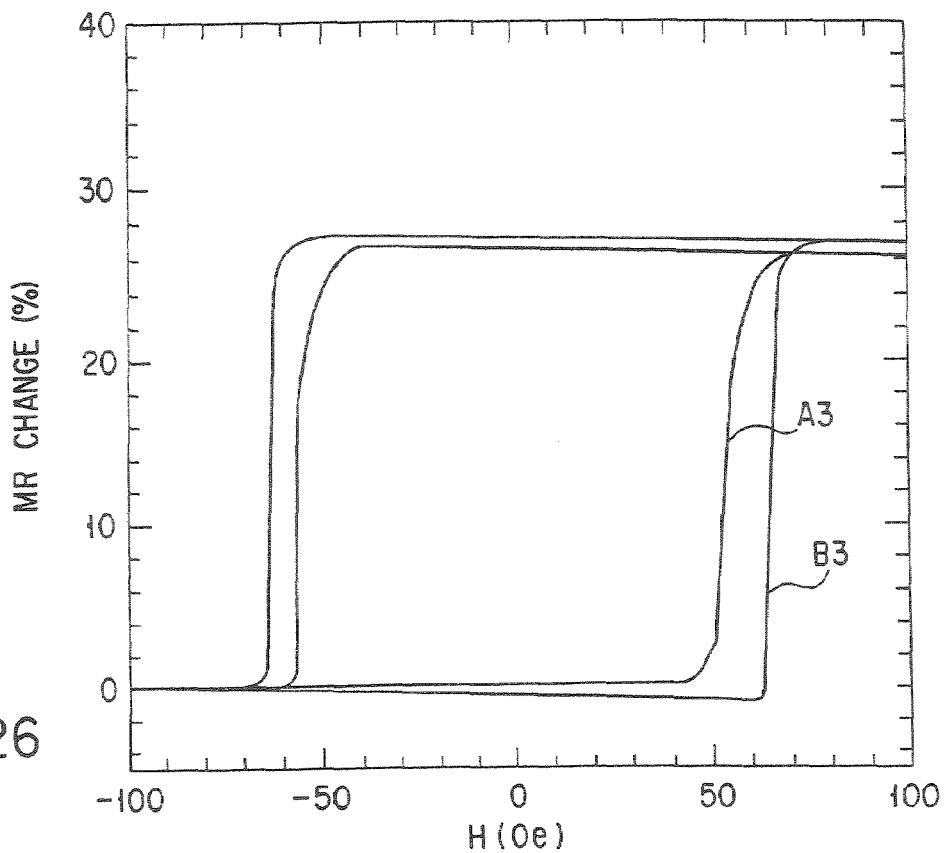
FIG. 26 shows a graph of magnetoresistive curves of the samples A3 and B3 in Embodiment 3.

The magnetoresistive curves of the samples A3 and B3 are shown in FIG. 26. The sample A3 has 26% of an MR change by a low magnetic field of 57 Oe, and the sample B3 has 27% of an MR change by a low magnetic field of 63 Oe.

Figure 27:
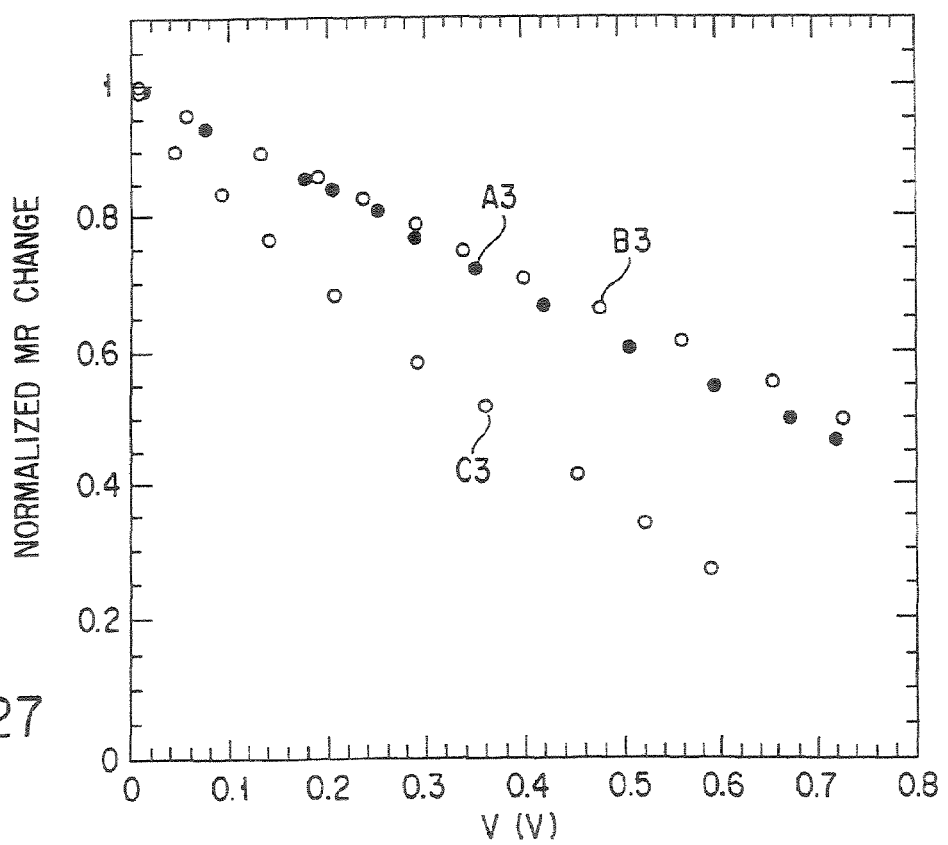
FIG. 27 shows a graph of applied voltage dependency of MR change for the samples A3, B3 and C3 in Embodiment 3.

FIG. 27 shows applied voltage dependency of the MR change for the samples A3, B3 and C3. Here, the MR change normalized by the value at 0V is shown in the drawing. The drawing exhibits that the samples A3 and B3 have a higher voltage of $V_{1/2}$ at which the MR change is reduced to half, and a lower reduction in the MR change with increased voltage, compared to the sample C3.

Figure 28:
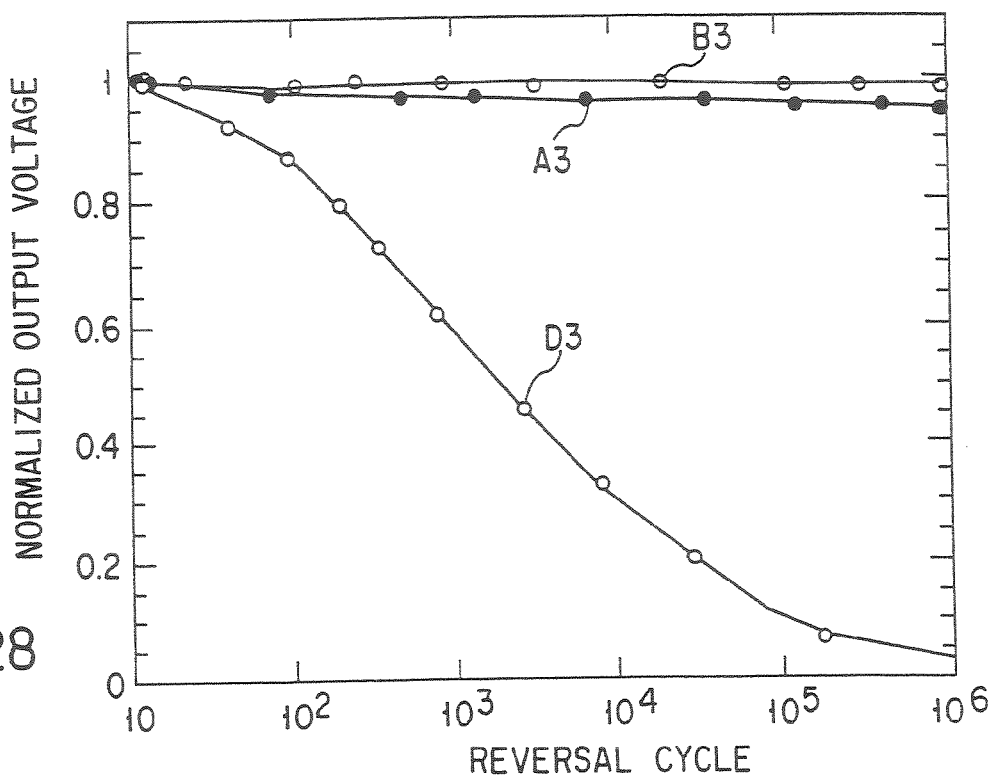
FIG. 28 shows a graph of relationships between reversal cycles of pulsed magnetic field and an output voltage for the samples A3, B3 and D3 in Embodiment 3.

Next, the samples A3, B3 and D3 were put in a solenoid coil, and fatigue tests of the magnetization pinned layer in a magnetically recorded state were conducted in a pulse magnetic field of 75 Oe. FIG. 28 shows relationships between the reversal cycles and the output voltage of the pulse magnetic field for the samples A3, B3 and D3. Here, The output voltage is normalized with the initial output voltage. As clearly shown in the drawing, the output voltage is remarkably reduced with increase in the reversal cycles of the pulse magnetic field, in the case of the sample D3. On the other hand, there is found no fatigue in the magnetization pinned layer in a magnetically recorded state in the case of the samples A3 and B3. Moreover, in comparison between the sample A3 and B3, there is found less fatigue in the sample B3 using an antiferromagnetically coupled three-layered structure of $Co_9Fe/Ru/Co_9Fe$ for the free layer.

It is evident from the above that the ferromagnetic double tunnel junction element having a structure shown in FIG. 3 shows suitable characteristics for applications to a magnetic memory device and a magnetic head.

When $SiO_2$, AlN, MgO, $LaAlO_3$, or $CaF_2$ was used for the dielectric layer, the similar tendency to the above was found.

Embodiment 4

An embodiment, where two kinds of ferromagnetic double tunnel junction elements (sample A4, and B4) with the structure shown in FIG. 4, or 5 were formed on a Si/$SiO_2$ substrate or $SiO_2$ substrate, will be described below.

The sample A4 has a structure sequentially stacked with a TaN underlayer, a first antiferromagnetic layer of a two-layered film of Ni—Fe/Co—Fe, a first dielectric layer of $Al_2O_3$, a second ferromagnetic layer of Co—Fe, a first nonmagnetic layer of Ru, a third ferromagnetic layer of Co—Fe, a second nonmagnetic layer of Ru, a fourth ferromagnetic layer of Co—Fe, a second dielectric layer of $Al_2O_3$, a fifth ferromagnetic layer of a two-layered film of Co—Fe/Ni—Fe, and a protective layer of Ta.

The sample B4 has a structure sequentially stacked with a TaN underlayer, a first ferromagnetic layer of a two-layered film of Ni—Fe/Co—Fe, a first dielectric layer of $Al_2O_3$, a second ferromagnetic layer of Co—Fe, a first nonmagnetic layer of Ru, a Co—Fe ferromagnetic layer/an Ir—Mn antiferromagnetic layer/a Co—Fe ferromagnetic layer, a second nonmagnetic layer of Ru, a fourth ferromagnetic layer of Co—Fe, a second dielectric layer of $Al_2O_3$, a fifth ferromagnetic layer of a two-layered film of CoFe/Ni—Fe, and a protective layer of Ta.

The sample A4 was made as follows. The substrate was put into a sputtering apparatus. After setting the initial pressure at $1 \times 10^{-7}$ Torr, Ar was introduced into the apparatus and the pressure was set at a predetermined value. Then, layers of Ta (5 nm)/$Ni_{81}Fe_{19}$ (16 nm)/$Co_4Fe_6$ (3 nm)/$Al_2O_3$ (1.7 nm)/CoFe (2 nm)/Ru (0.7 nm)/CoFe (2 nm)/Ru (0.7 nm)/CoFe (2 nm)/$Al_2O_3$ (2 nm)/$Co_4Fe_6$ (3 nm)/$Ni_{81}Fe_{19}$ (16 nm)/Ta (5 nm) were sequentially stacked on the substrate. Here, the $Al_2O_3$ layer was formed by depositing Al using an Al target in pure Ar gas, by introducing oxygen into the apparatus without breaking the vacuum, and then by exposing it to the plasma oxygen.

After deposition of the above stacked film, a first resist pattern defining a lower wire shape with a width of 100 μm was formed on the uppermost Ta protective layer by photolithography, and the above film was processed by ion milling.

Next, after removal of the first resist pattern, a second resist pattern defining a junction dimensions was formed on the uppermost Ta protective layer by photolithography, and the layers of CoFe/Ru/CoFe/Ru/CoFe/Al$_2$O$_3$/Co$_4$Fe$_6$/Ni$_{81}$Fe$_{19}$/Ta above the first Al$_2$O$_3$ layer were processed by ion milling. The Al$_2$O$_3$ layer with a thickness of 300 nm was deposited by electron beam evaporation, while leaving the second resist pattern, and then the second resist pattern and the Al$_2$O$_3$ layer on the above pattern were lifted off, thereby an interlayer insulation film was formed in regions except the junction region.

Then, after forming the third resist pattern covering regions except the region of the electrode wire, the surface was reverse-sputtered and cleaned. After Al was deposited allover the surface, the third resist pattern and the Al on the pattern were lifted off, thereby the Al electrode wire was formed. Then, after introduction into a heat-treating furnace in the magnetic field, the uniaxial anisotropy was introduced to the pinned layer.

The sample B4 was made as follows. The substrate was put into a sputtering apparatus. After setting the initial pressure at 1×10$^{-7}$ Torr, Ar was introduced into the apparatus and the pressure was set at a predetermined value. Then, layers of Ta (5 nm)/Ni$_{81}$Fe$_{91}$ (15 nm)/Co$_9$Fe (2 nm)/Al$_2$O$_3$ (1.5 nm)/CoFe (1.5 nm)/Ru (0.7 nm)/CoFe (1.5 nm)/Ir—Mn (14 nm)/CoFe (1.5 nm)/Ru (0.7 nm)/CoFe (1.5 nm)/Al$_2$O$_3$ (2 nm)/Co$_9$Fe (2 nm)/Ni$_{81}$Fe$_{19}$ (15 nm)/Ta (5 nm) were sequentially stacked on the substrate. Here, the Al$_2$O$_3$ layer was formed in a similar manner to the above method.

After deposition of the above stacked film, a first resist pattern defining a lower wire shape with a width of 100 μm was formed on the uppermost Ta protective layer by photolithography, and the above film was processed by ion milling. Next, after removal of the first resist pattern, a second resist pattern defining a junction dimensions was formed on the uppermost Ta protective layer by photolithography, and the layers of CoFe/Ru/CoFe/Ir—Mn/Cofe/Ru/CoFe/Al$_2$O$_3$/Co$_9$Fe/Ni$_{81}$Fe$_{19}$/Ta above the first Al$_2$O$_3$ layer were processed by ion milling. Then, in a similar manner to the above, the formation of the Al$_2$O$_3$ interlayer insulation film, and that of the Al electrode wire, and the introduction of the uniaxial anisotropy to the pinned layer were performed.

For comparison, samples C4 and D4 described in the following were made.

The sample C4 is a ferromagnetic single tunnel junction element, and has a stacked structure of Ta (5 nm) Ni$_{81}$Fe$_{19}$ (16 nm)/Co$_4$Fe$_6$ (3 nm)/Al$_2$O$_3$ (1.7 nm)/CoFe (2 nm)/Ru (0.7 nm)/CoFe (2 nm)/Ru (0.7 nm)/CoFe (2 nm)/Ta (5 nm).

The sample D4 is a ferromagnetic double tunnel junction element without an antiferromagnetic layer, and has a stacked structure of Ta (5 nm)/Ni$_{81}$Fe$_{19}$ (16 nm)/Co$_4$Fe$_6$ (3 nm)/Al$_2$O$_3$ (1.7 nm)/CoFe (6 nm)/Al$_2$O$_3$ (2 nm)/Co$_4$Fe$_6$ (3 nm) Ni$_{81}$Fe$_{19}$ (16 nm)/Ta (5 nm).

Figure 29:
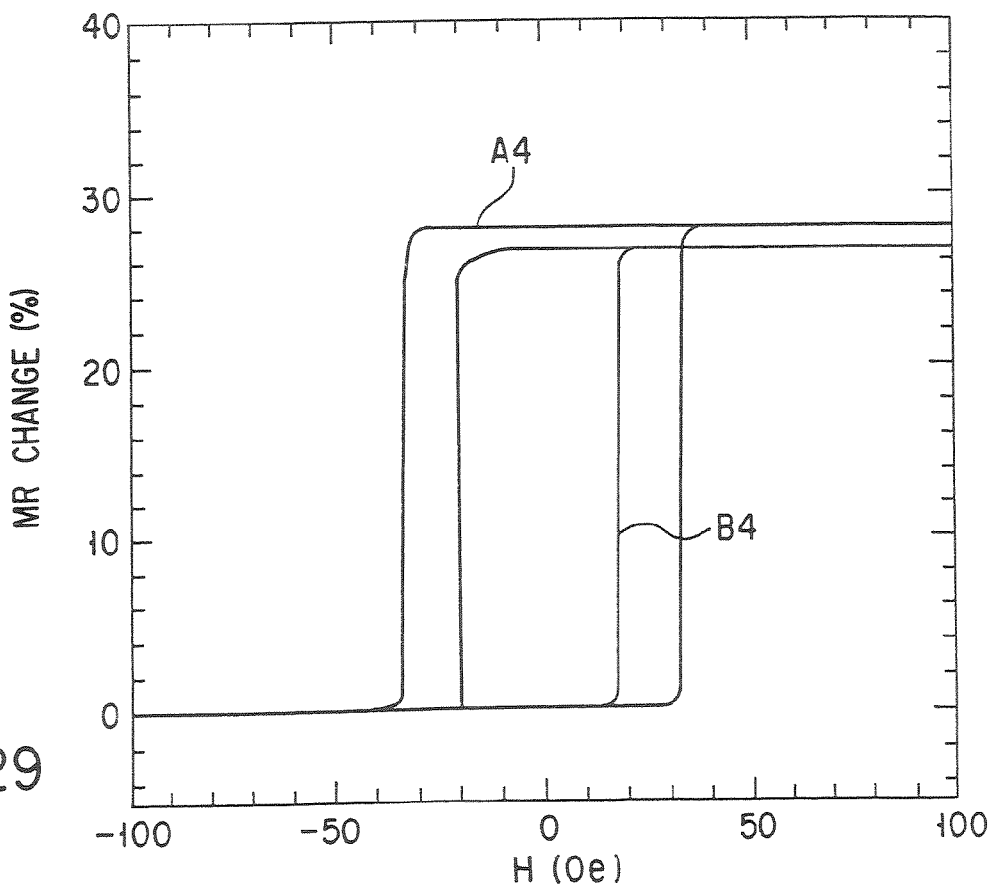
FIG. 29 shows a graph of magnetoresistive curves of the samples A4 and B4 in Embodiment 4.

The magnetoresistive curves of the samples A4 and B4 are shown in FIG. 29. The sample A4 has 28% of an MR change by a low magnetic field of 33 Oe, and the sample B4 has 26% of an MR change by a low magnetic field of 18 Oe.

Figure 30:
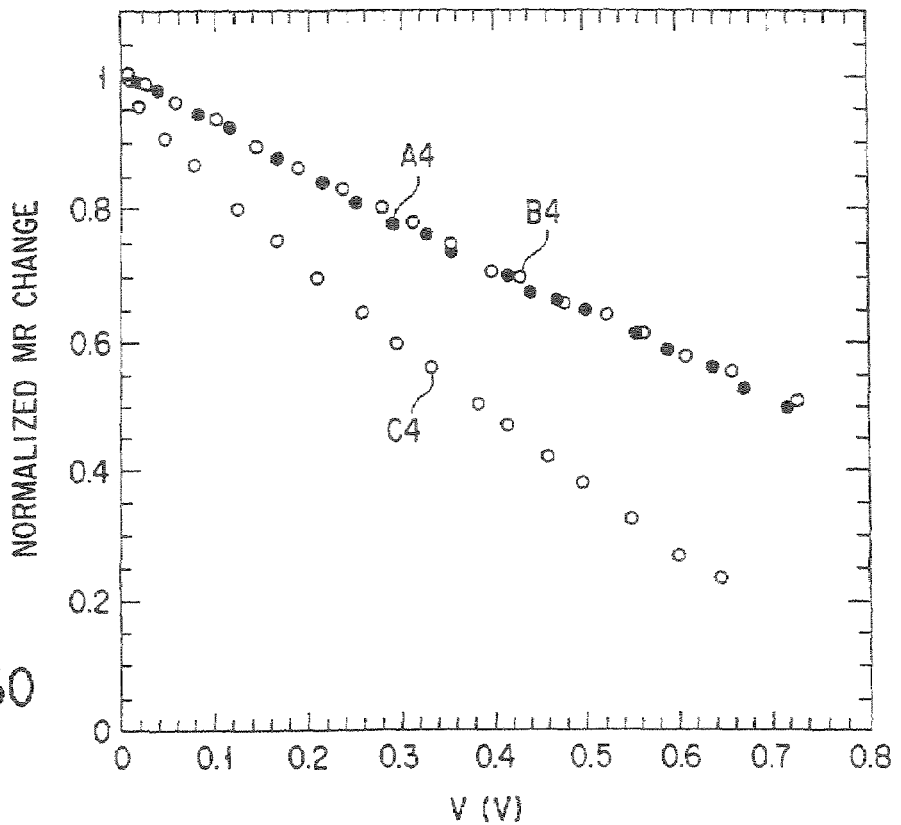
FIG. 30 shows a graph of applied voltage dependency of MR change for the samples A4, B4 and C4 in Embodiment 4.

FIG. 30 shows applied voltage dependency of the MR change for the samples A4, B4 and C4. Here, the MR change normalized by the value at 0V is shown in the drawing. The drawing exhibits that the samples A4 and B4 have a higher voltage of V$_{1/2}$ at which the MR change is reduced to half, and a lower reduction in the MR change with increased voltage, compared to the sample C4.

Figure 31:
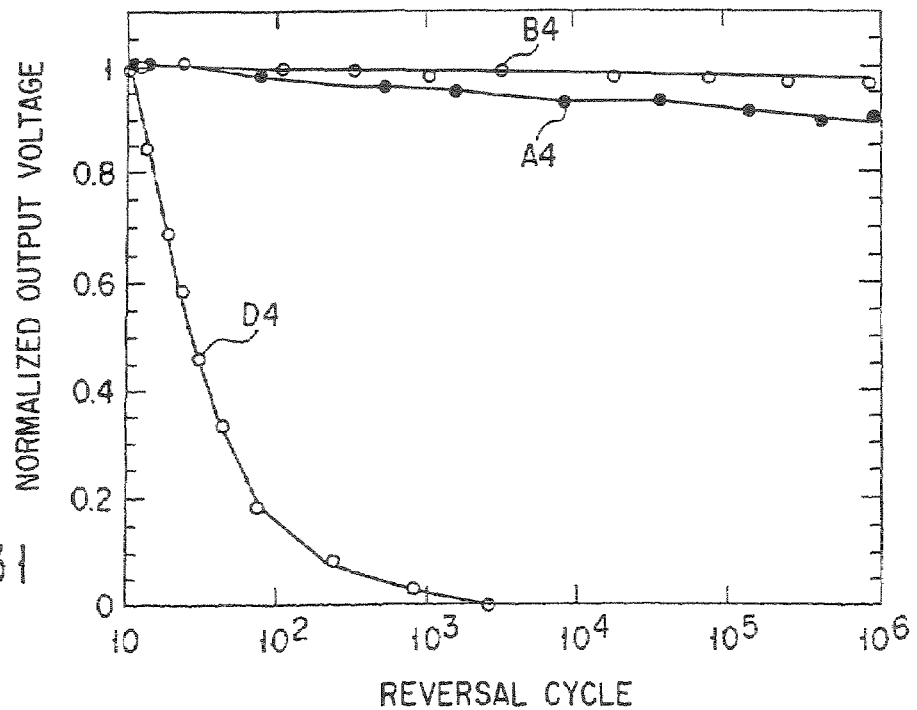
FIG. 31 shows a graph of relationships between reversal cycles of pulsed magnetic field and an output voltage for the samples A4, B4 and D4 in Embodiment 4.

Next, the samples A4, B4 and D4 were put in a solenoid coil, and fatigue tests of the magnetization pinned layer in a magnetically recorded state were conducted in a pulse magnetic field of 40 Oe. FIG. 31 shows relationships between the reversal cycles and the output voltage of the pulse magnetic field for the samples A4, B4 and D4. Here, the output voltage is normalized with the initial output voltage. As clearly shown in the drawing, the output voltage is remarkably reduced with increase in the reversal cycles of the pulse magnetic field, in the case of the sample D4. On the other hand, there is found no fatigue in the magnetization pinned layer in a magnetically recorded state in the case of the samples A4 and B4. Moreover, in comparison between the samples A4 and B4, there is found less fatigue in the sample B4 using a seven-layered structure of CoFe/Ie/CoFe/Ir—Mn/CoFe/Ir/CoFe in which an antiferromagnetic layer is inserted into a magnetization pinned layers.

It is evident from the above that the ferromagnetic double tunnel junction element having a structure shown in FIG. 4 shows suitable characteristics for applications to a magnetic memory device and a magnetic head.

When SiO$_2$, AlN, MgO, LaAlO$_3$, or CaF$_2$ was used for the dielectric layer, the similar tendency to the above was found.

Embodiment 5

An embodiment, where a ferromagnetic double tunnel junction elements (samples A5 and B5) with the structure shown in FIG. 32 was made on a Si/SiO$_2$ substrate or SiO$_2$ substrate, considering the MRMA of FIG. 7 or FIG. 9, will be described below.

The sample A5 has a structure sequentially stacked with a TaN underlayer, a first antiferromagnetic layer of Fe—Mn, a first ferromagnetic layer of a two-layered film of Ni—Fe/Co—Fe, a first dielectric layer of Al$_2$O$_3$, a second ferromagnetic layer of Co$_9$—Fe, a second dielectric layer of Al$_2$O$_3$, a third ferromagnetic layer of Co—Fe, a bit line (a third ferromagnetic layer of Ni—Fe, a second antiferromagnetic layer of Fe—Mn, a metal layer of Al).

The sample B5 has a structure sequentially stacked with a TaN underlayer, a first antiferromagnetic layer of Ir—Mn, a first ferromagnetic layer of Co—Fe, a first dielectric layer of Al$_2$O$_3$, a second ferromagnetic layer of a three-layered film of Co—Fe/Ni—Fe/Co—Fe, a second dielectric layer of Al$_2$O$_3$, a third ferromagnetic layer of Co—Fe, a bit line (a third ferromagnetic layer of Co, a second antiferromagnetic layer of Ir—Mn, a metal layer of Al).

Figure 32:
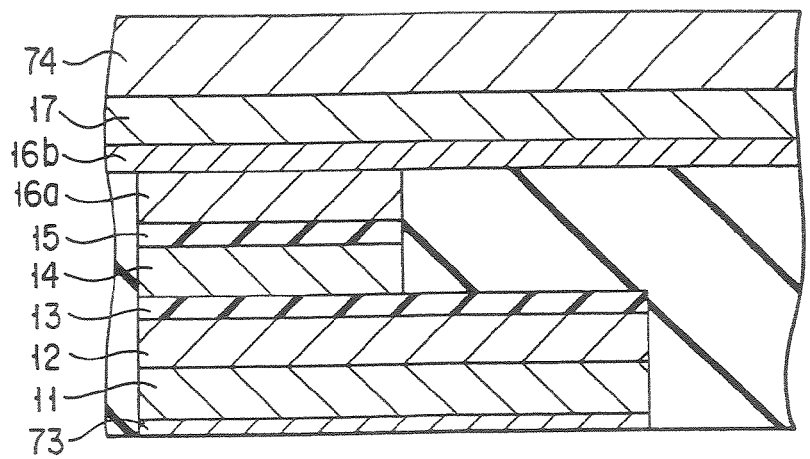
FIG. 32 shows a sectional view of a magnetoresistive element in Embodiment 5 in which a pinned layer constitutes a part of a bit line.

As shown in FIG. 32, both of the samples A5 and B5 have a larger area of the second antiferromagnetic layer than that of the junction area.

The sample A5 was made as follows. The substrate was put into a sputtering apparatus. After setting the initial pressure at 1×10$^{-7}$ Torr, Ar was introduced into the apparatus and the pressure was set at a predetermined value. Then, layers of Ta (5 nm)/Fe$_{54}$Mn$_{46}$ (18 nm)/Ni$_8$Fe$_2$(5 nm)/CoFe (2 nm)/Al$_2$O$_3$ (1.7 nm)/Co$_9$Fe (3 nm)/Al$_2$O$_3$ (2 nm)/CoFe (2 nm)/Ta (5 nm) were sequentially stacked on the substrate. Here, the Al$_2$O$_3$ layer was formed by depositing Al using an Al target in pure Ar gas, by introducing oxygen into the apparatus without breaking the vacuum, and then by exposing it to the plasma oxygen.

After deposition of the above stacked film, a first resist pattern defining a lower wire shape with a width of 50 μm was formed on the uppermost Ta layer by photolithography, and the above film was processed by ion milling.

Next, after removal of the first resist pattern, a electron beam (EB) resist was applied to the uppermost Ta layer, and fine processing of each layer above the Al$_2$O$_3$ layer was performed, using an EB lithography apparatus, to make ferromagnetic tunnel junction element with a junction area of 1×1

$\mu m^2$, 0.5×0.5 $\mu m^2$ or 0.15×0.15 $\mu m^2$. The $Al_2O_3$ layer with a thickness of 300 nm was deposited by electron beam evaporation, while leaving the EB resist pattern, and then the EB resist pattern and the $Al_2O_3$ layer on the above pattern were lifted off, thereby an interlayer insulation film was formed in regions except the junction region.

Then, after forming the third resist pattern covering regions except the region of the electrode wire, the surface was reverse-spattered and cleaned. Further, the Ta layer was removed. Then, $Ni_8Fe_2$(5 nm)/$Fe_{54}Mn_{46}$ (18 nm)/Al (5 nm) were sequentially stacked as the electrode wire of the bit line. The third resist pattern and the electrode wire on the pattern were lifted off. Then, after introduction into a heat-treating furnace in the magnetic field, the uniaxial anisotropy was introduced to the pinned layer.

The sample B5 was made as follows. The substrate was put into a sputtering apparatus. After setting the initial pressure at $1×10^{-7}$ Torr, Ar was introduced into the apparatus and the pressure was set at a predetermined value. Then, layers of Ta (5 nm)/$Ir_{22}Mn_{78}$ (18 nm)/CoFe (3 nm)/$Al_2O_3$ (1.5 nm)/CoFe (1 nm)/$Ni_8Fe_2$(3 nm)/CoFe (1 nm)/$Al_2O_3$ (1.8 nm)/CoFe (3 nm)/Ta (5 nm) were sequentially stacked on the substrate. Here, the $Al_2O_3$ layer was formed in a similar manner to the above method.

After deposition of the above stacked film, a first resist pattern defining a lower wire shape with a width of 50 $\mu m$ was formed on the uppermost Ta protective layer by photolithography, and the above film was processed by ion milling.

Next, after removal of the first resist pattern, an electron beam (EB) resist was applied to the uppermost Ta layer, and fine processing of each layer above the $Al_2O_3$ layer was performed, using an EB lithography apparatus, to make ferromagnetic tunnel junction element with a junction area of 1×1 $\mu m^2$, 0.5×0.5 $\mu m^2$ or 0.15×0.15 $\mu m^2$. The $Al_2O_3$ layer with a thickness of 300 nm was deposited by electron beam evaporation, while leaving the second resist pattern, and the EB resist pattern and the $Al_2O_3$ layer on the above pattern were lifted off. Then, after forming the third resist pattern covering regions except the region of the electrode wire, the surface was reverse-spattered and cleaned. Further, the Ta layer was removed. Then, Co/$Ir_{22}Mn_{78}$ (18 nm)/Al (5 nm)/Al (5 nm) were sequentially stacked as the electrode wire of the bit line. The third resist pattern and the electrode wire on the pattern were lifted off. Then, after introduction into a heat-treating furnace in the magnetic field, the uniaxial anisotropy was introduced to the pinned layer.

For comparison, samples C5, D5 and E5 described in the following were made.

The sample C5 is a ferromagnetic single tunnel junction element, and has a stacked structure of Ta (5 nm)/$Ir_{22}Mn_{78}$ (18 nm)/CoFe (3 nm)/$Al_2O_3$ (1.5 nm)/CoFe (1 nm)/$Ni_8Fe_2$(3 nm)/CoFe (1 nm)/Ta (5 nm).

The sample D5 has the similar stacked structure to that of the sample B5, that is a structure sequentially stacked with Ta ((5 nm)/$Ir_{22}Mn_{78}$ (18 nm)/CoFe (3 nm)/$Al_2O_3$ (1.5 nm)/CoFe (1 nm)/$Ni_8Fe_2$(3 nm)/CoFe (1 nm)/$Al_2O_3$ (1.8 nm)/CoFe (3 nm)/$Ir_{22}Mn_{78}$ (18 nm)/Ta (5 nm). However, the structure is different from that of FIG. 32, that is, it is processed so that the upper second antiferromagnetic layer of IrMn (and the Ta protective layer) has the same area as that of the junction area. In addition, the bit lines comprise only an Al layer.

The sample E5 is a ferromagnetic double tunnel junction element without an antiferromagnetic layer, and has a stacked structure of Ta (5 nm)/CoFePt (13 nm)/$Al_2O_3$ (1.5 nm)/CoFe (1 nm)/Ni18FE2 (2 nm)/CoFe (1 nm)/$Al_2O_3$ (1.8 nm)/CoFePt (13 nm)/Ta (5 nm).

Figure 33:
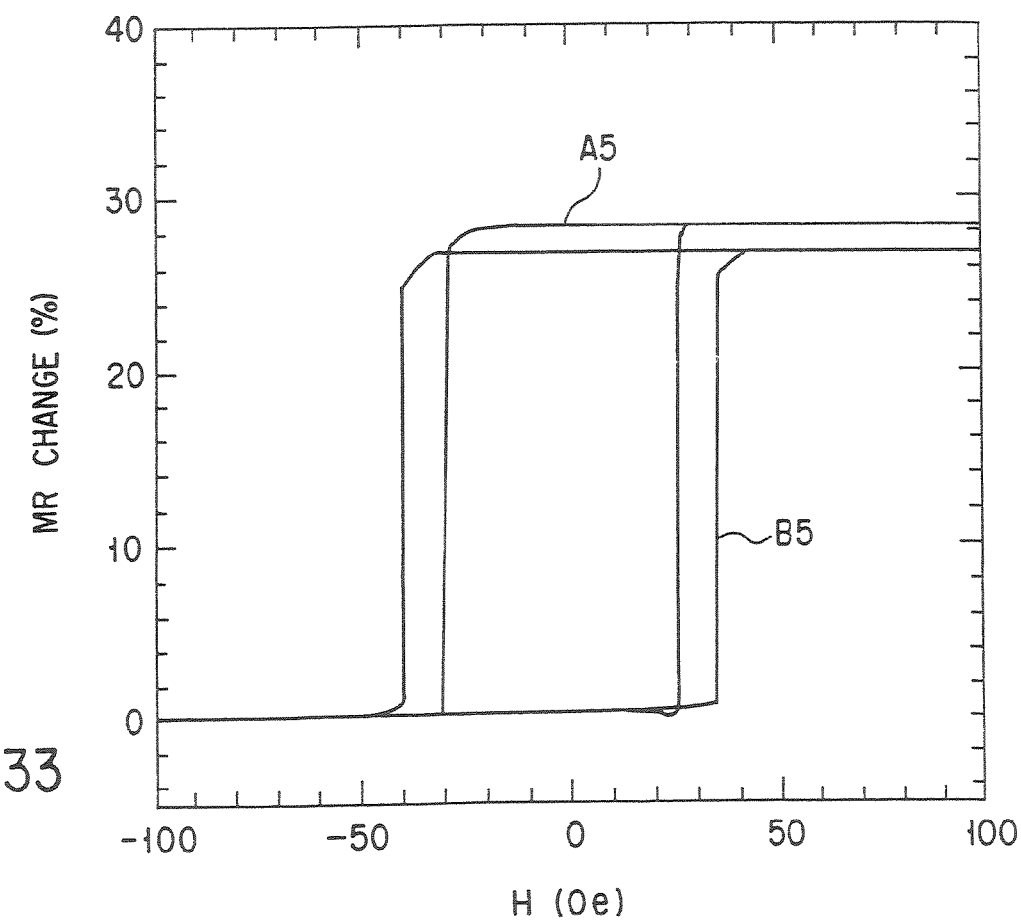
FIG. 33 shows a graph of magnetoresistive curves of the samples A5 and B5 in Embodiment 5.

The magnetoresistive curves of the samples A5 and B5 are shown in FIG. 33. The sample A5 has 28% of an MR change by a low magnetic field of 29 Oe, and the sample B5 has 27% of an MR change by a low magnetic field of 39 Oe.

Figure 34:
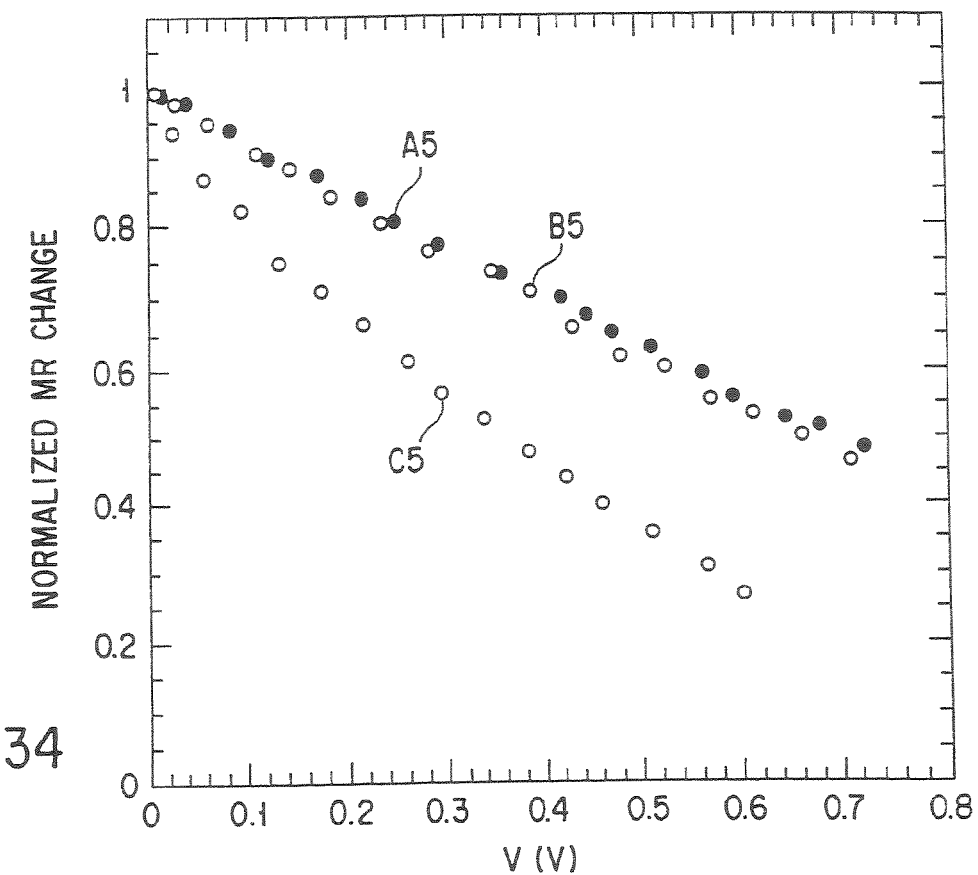
FIG. 34 shows a graph of applied voltage dependency of MR change for the samples A5, B5 and C5 in Embodiment 5.

FIG. 34 shows applied voltage dependency of the MR change for the samples A5, B5 and C5. Here, the MR change normalized by the value at 0V is shown in the drawing. The drawing exhibits that the samples A5 and B5 have a higher voltage of $V_{1/2}$ at which the MR change is reduced to half, and a lower reduction in the MR change with increased voltage, compared to the sample C5.

Figure 35:
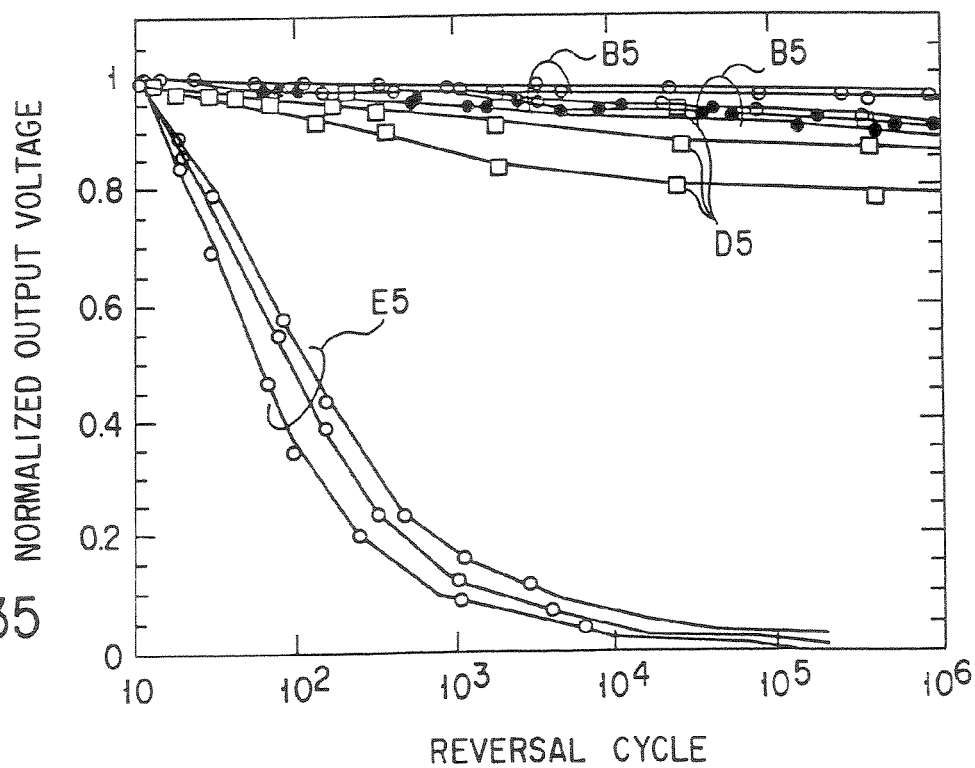
FIG. 35 shows a graph of relationships between reversal cycles of pulsed magnetic field and an output voltage for the samples A5, B5, D5 and E5 in Embodiment 5.

Next, the samples A5, B5, D5 and E5 were put in a solenoid coil, and fatigue tests of the magnetization pinned layer in a magnetically recorded state were conducted in a pulse magnetic field of 70 Oe. FIG. 35 shows relationships between the reversal cycles and the output voltage of the pulse magnetic field for the samples A5, B5, D5 and E5. Here, the output voltage is normalized with the initial output voltage. As clearly shown in the drawing, the output voltage is remarkably reduced with increase in the reversal cycles of the pulse magnetic field, in the case of the sample E5. In the case of D5 shows a tendency to cause much more fatigue as the lower junction area is reduced. It is assumed to be a reason that the smaller area causes deterioration of the upper magnetization pinned layer by process damage and the like. On the other hand, there is found no fatigue in the magnetization pinned layer in a magnetically recorded state in the case of the samples A5 and B5. Thus, it is evident that it is advantageous to have a structure with the upper antiferromagnetic layer as a part of bit lines as shown in FIG. 32.

It is evident from the above that the ferromagnetic double tunnel junction element having a structure shown in FIG. 32 shows suitable characteristics for applications to, especially, a magnetic memory device.

When $SiO_2$, AlN, MgO, $LaAlO_3$, or $CaF_2$ was used for the dielectric layer, the similar tendency to the above was found.

Embodiment 6

A ferromagnetic double tunnel junction element having a basic structure shown in FIGS. 1 to 4 was made on an Si/$SiO_2$ substrate or an $SiO_2$ substrate, in a similar manner to those of the Embodiments 1 to 4. The stacked structures of the above elements are shown in Table 1. Here, any one of Ta, Ti, Ti/Pt, Pt, Ti/Pd, Ta/Pt, Ta/Pd, and $TiN_x$ was used for the underlayer and the protective layer.

For the above samples, voltage of $V_{1/2}$ at which the MR change is reduced to half, and a ratio of the output at 10000 reversal cycles and the initial output of the free layer (magnetic recording layer) are shown in Table 1. Any samples have a higher MR change and a lower reduction in the MR change with increased voltage, compared to those of the ferromagnetic single tunnel junction element. Moreover, there is little reduction in the output voltage, and less fatigue with repeated magnetization reversal of the free layer (magnetic recording layer).

Thus, it is evident that the above elements show suitable characteristics for applications to a magnetoresistive head, a sensor, and a magnetic memory device.

| Sample | $V_{1/2}$ (V) | $V(100000)/V_{initial}$ |
|---|---|---|
| $Ir_{22}Mn_{78}/Co_9Fe/SiO_2/Co_7Fe_3/SiO_2/Co_9Fe/Ir_{22}Mn_{78}$ (18 nm)(2 nm)(1.8 nm)(2.4 nm)(1.9 nm)(3 nm)(20 nm) | 0.71 | 0.98 |
| $FeMn/Co_7Fe_2Ni/AlN/Co_7Fe_3/AlN/Co_7Fe_2Ni/FeMn$ (17 nm)(3 nm)(1.9 nm)(2.4 nm)(2.1 nm)(3 nm)(19 nm) | 0.7 | 0.96 |
| $PtMn/Ni_8Fe_2/Co_9Fe/Al_2O_3/Co_7Fe_3/Al_2O_3/Co_9Fe/Ni_8Fe_2/PtMn$ (16 nm)(3 nm)(2 nm)(1.4 nm)(2 nm)(1.9 nm)(1 nm)(2 nm)(20 nm) | 0.79 | 0.99 |
| $Ir_{22}Mn_{78}/Co_4Fe_6/MgO/CoFe/Ni_8Fe_2/CoFe/MgO/Co_4Fe_6/Ir_{22}Mn_{78}$ (17 nm)(3 nm)(1.7 nm)(1 nm)(1 nm)(1 nm)(2.3 nm)(3 nm)(17 nm) | 0.76 | 0.96 |
| $Co_{85}Ni_{15}/SiO_2/Co_7Fe_2Ni/Ir_{22}Mn_{78}/Co_7Fe_2Ni/SiO_2/Co_{85}Ni_{15}$ (14 nm)(2 nm)(1.5 nm)(18 nm)(1.5 nm)(2 nm)(17 nm) | 0.77 | 0.97 |
| $Ni_8Fe_2/CoFe/ALN/Co/FeNi_2/FeMn/FeNi_2/Co/AlN/Co/Fe$ (1 nm)(7 nm)(1.9 nm)(1 nm)(1 nm)(18 nm)(1.5 nm)(1 nm)(7 nm)(1 nm) | 0.75 | 0.95 |
| $Co_{85}Fe_{15}/Al_2O_3/Co_7Fe_2Ni/PtMn/Co_7Fe_2Ni/Al_2O_3/Co_{85}Fe_{15}$ (10 nm)(1.7 nm)(2 nm)(18 nm)(2 nm)(2 nm)(14 nm) | 0.81 | 0.91 |
| $Co_{80}Pt_{20}/MgO/CoFe/Ru/CoFe/NiMn/Co_6Fe_3Ni/MgO/Co_{80}pt_{20}$ (12 nm)(2.1 nm)(1.5 nm)(0.7 nm)(1 nm)(15 nm)(2 nm)(2.2 nm)(15 nm) | 0.74 | 0.94 |
| $Ir_{22}Mn_{78}/CoFeNi/SiO_2/FeCo_2Ni/FeMn/FeCo_2Ni/SiO_2/CoFeNi/Ir_{22}Mn_{78}$ (19 nm)(3 nm)(2 nm)(1.6 nm)(15 nm)(1.6 nm)(2 nm)(2 nm)(19 nm) | 0.71 | 0.91 |
| $Ir_{22}Mn_{78}/Co_9Fe/Al_2O_3/FeCo/Ir_{22}Mn_{78}/FeCo/Al_2O_3/Co_9Fe/Ir_{22}Mn_{78}$ (19 nm)(3 nm)(1.8 nm)(1.6 nm)(13 nm)(1.6 nm)(2 nm)(2 nm)(19 nm) | 0.78 | 0.98 |
| $Ir_{22}Mn_{78}/CoFe/AlN/FeCo_3Ni/Ir_{20}Mn_{80}/FeCo_3Ni/AlN/CoFe/Ir_{22}Mn_{78}$ (19 nm)(2 nm)(2.2 nm)(1.5 nm)(17 nm)(1.5 nm)(2.2 nm)(2 nm)(19 nm) | 0.78 | 0.98 |
| $PtMn/CoFeNi/MgO/FeCo_2Ni_2/FeMn/FeCo_2Ni_2/MgO/CoFeNi/PtMn$ (20 m)(3 nm)(2.2 nm)(1.6 nm)(15 nm)(1.6 nm)(2.2 nm)(2 nm)(20 nm) | 0.81 | 0.91 |
| $CoFeNi/SiO_2/FeCo/Ru/FeCo/Ru/Co/SiO_2/CoFeNi$ (15 nm)(2 nm)(1.5 nm)(0.7 nm)(1.5 nm)(0.7 nm)(1.5 nm)(2 nm)(17 nm) | 0.73 | 0.97 |
| $CoFePt/AlN/Co/Ru/Co/Ru/Co/AlN/CoFePt$ (15 nm)(2 nm)(1 nm)(0.7 nm)(1 nm)(0.7 nm)(1 nm)(2 nm)(17 nm) | 0.78 | 0.98 |
| $CoFeNi/SiO_2/FeCo/Ru/FeCo/Ir_{22}Mn_{78}/CoFe/Ru/CoFe/SiO_2/CoFeNi$ (14 nm)(2 nm)(1.7 nm)(0.8 nm)(1.6 nm)(17 nm)(1.6 nm)(0.8 nm)(1.7 nm)(2.1 nm)(14 nm) | 0.78 | 0.98 |
| $CoFe/AlN/FeCo/Ir/FeCo/PtMn/CoFe/Ir/CoFe/AlN/CoFe$ (15 nm)(1.4 nm)(1 nm)(0.9 nm)(1 nm)(17 nm)(1 nm)(0.9 nm)(1 nm)(2.1 nm)(15 nm) | 0.81 | 0.91 |

Note that, in the present invention, atomic diffusion and mixing between layers may be caused. For example, under strong spattering, it is thought that the atomic diffusion may be caused between a NiFe alloy layer and a Co-based alloy layer, or between these layers and a nonmagnetic layer or an antiferromagnetic layer. In addition, it is assumed that the similar atomic diffusion may be caused by heat treatment, depending on the temperature and time. If constituent materials for each layer show required magnetic characteristics in the present invention even if such atomic diffusion is caused and are included in the materials defined in the invention, they may be included in the scope of the present invention.

Embodiment 7

An embodiment, where three kinds of ferromagnetic double tunnel junction elements (sample T1, T2 and T3), having different thickness of the free layer, with a structure shown in FIG. 1 were made on a $Si/SiO_2$ substrate or $SiO_2$ substrate, will be described below.

The sample T1 has a structure sequentially stacked with layers of a TaN underlayer, a first antiferromagnetic layer of a two-layered film of Fe—Mn/Ni—Fe, a first ferromagnetic layer of CoFe, a first dielectric layer of $Al_2O_3$, a second ferromagnetic layer of $Co_9Fe$, a second dielectric layer of $Al_2O_3$, a third ferromagnetic layer of CoFe, a second antiferromagnetic layer of a two-layered film of Ni—Fe/Fe—Mn, and a Ta protective layer, and the free layer that is the second ferromagnetic layer of $Co_9Fe$ is 2.5 nm thick.

The sample T1 was made as follows. The substrate was put into a sputtering apparatus. After setting the initial pressure at $1\times10^{-7}$ Torr, Ar was introduced into the apparatus and the pressure was set at a predetermined value. Then, layers of Ta (5 nm)/$Fe_{54}Mn_{46}$ (20 nm)/$Ni_8Fe_2$(5 nm)/CoFe (3 nm)/$Al_2O_3$ (1.7 nm)/$Co_9Fe$ (2.5 nm)/$Al_2O_3$ (2 nm)/CoFe (3 nm)/$Ni_8Fe_2$(5 nm)/$Fe_{54}Mn_{46}$ (20 nm)/Ta (5 nm) were sequentially stacked on the substrate. Here, the $Al_2O_3$ layer was formed by depositing Al using an Al target in pure Ar gas, by introducing oxygen into the apparatus without breaking the vacuum, and then by exposing it to the plasma oxygen.

After deposition of the above stacked film, a resist pattern defining a lower wire shape with a width of 100 μm was formed on the uppermost Ta protective layer by photolithography, and the above film was processed by ion milling.

Then, after removal of the resist pattern, a Ti hard mask defining a junction dimensions was formed on the uppermost Ta protective layer by photolithography and RIE (reactive ion etching), and the layers of $Co_9Fe/Al_2O_3/CoFe/Ni$—Fe/Fe—Mn/Ta above the first $Al_2O_3$ layer were processed by ion milling. The junction widthes were variously changed by the above process. The EB lithography was used for fabricating elements with a junction width 1 μm or less. After forming the resist pattern on the junction region, and deposition of a $SiO_2$ layer with a thickness of 300 nm by spattering or plasma CVD, the resist pattern and the $SiO_2$ layer on the pattern were lifted off, thereby interlayer insulation film was formed on regions except the junction region.

Then, after forming a resist pattern covering regions except the region of the electrode wire, the surface was reverse-spattered and cleaned. After Al was deposited allover the surface, the resist pattern and the Al on the pattern were lifted off, thereby the Al electrode wire was formed. Then, after introduction into a heat-treating furnace in the magnetic field, the uniaxial anisotropy was introduced to the pinned layer.

The sample T2 has a free layer, the second ferromagnetic layer of $Co_9Fe$, of 7 nm thick, and it was made in a similar manner to that of the sample 11.

The sample T3 has a free layer, the second ferromagnetic layer of $Co_9Fe$, of 17 nm thick, and it was made in a similar manner to that of the sample 11.

Figure 36:
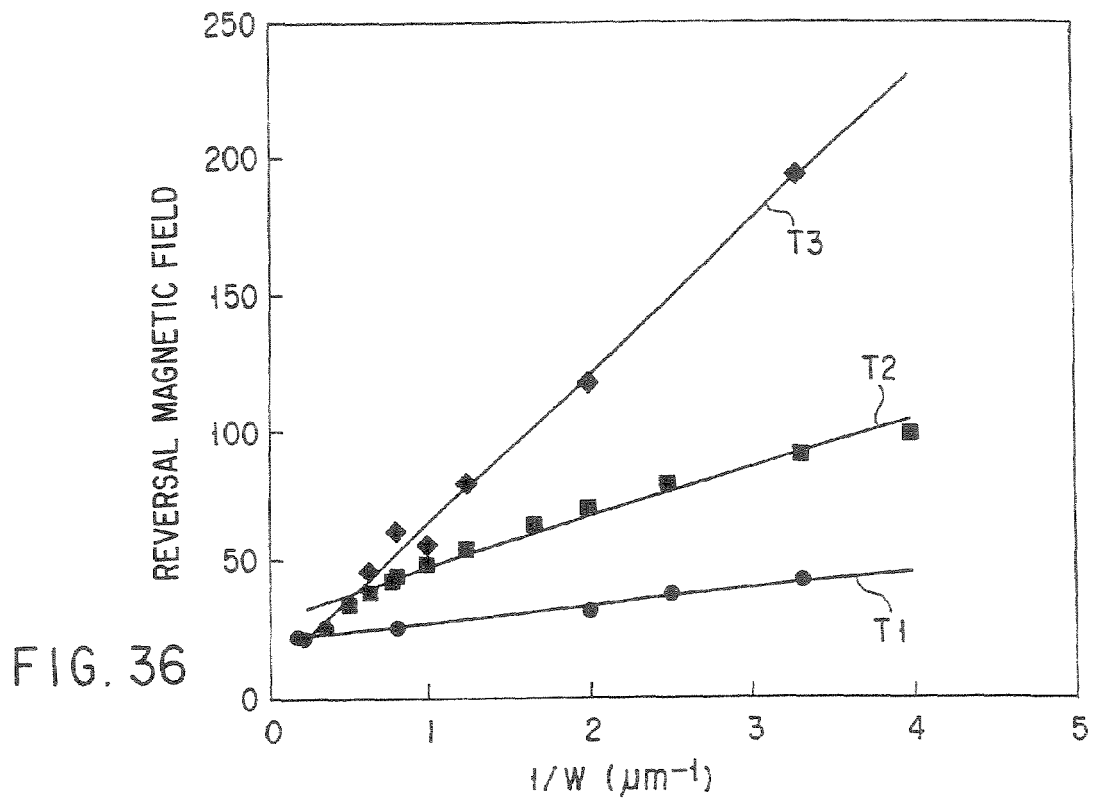
FIG. 36 shows a graph of relationships between a junction width and an MR change for the samples T1, T2 and T3 in Embodiment 7.

FIG. 36 shows relationships between junction width of the element and reversal magnetic field of the free layer for the samples T1 and T2. Here, the horizontal axis is a reciprocal (1/W) of the junction width W, in the drawing. As shown in FIG. 36, any of the samples have the more increased reversal magnetic field according to the more reduced junction width. That is, in the application of the MRAM, there may be the more increased power consumption for writing, according to the more reduced junction width. However, in the case of the sample T1 having a thin free layer, the inclination of the straight line is gentle, and the increase of the reversal magnetic field according to the reduced junction width may be controlled. On the other hand, in the case of the samples T2 and T3 having a relatively thick free layer, the increase of the reversal magnetic field according to the reduced junction width is remarkable, and in the application of the MRAM, the power consumption for writing is likely to be remarkably increased. Here, taking up elements with a junction width of 0.25 μm (1/W=4) obtained by a current processing technology, the reversal magnetic fields will be compared. In the case of the sample T1, the reversal magnetic field is lower than 100 Oe, and further fine processing may be realized. On the other hand, in the case of the samples T2 and T3, the reversal magnetic field exceeds 100 Oe, and the further fine processing may be difficult, since the power consumption for writing is already high in the application of the MRAM.

Figure 37:
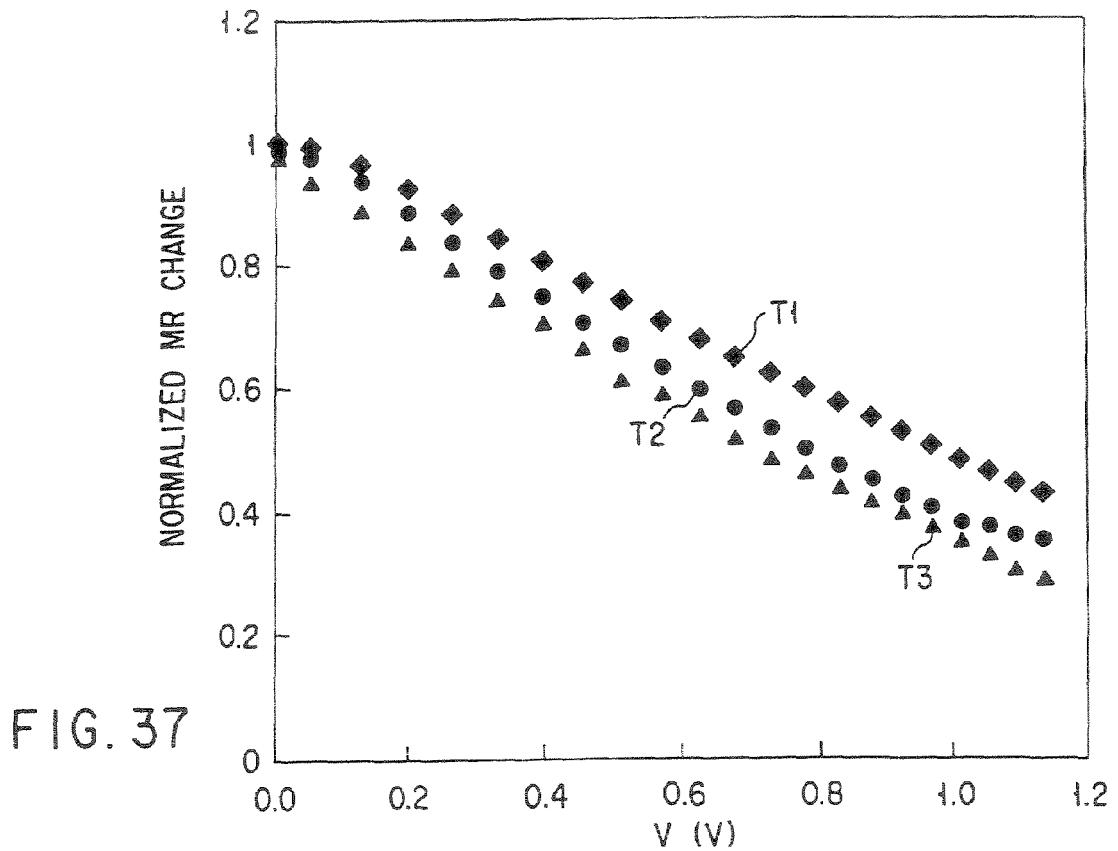
FIG. 37 shows a graph of applied voltage dependency of MR change for the samples T1, T2 and T3 in Embodiment 7.

FIG. 37 shows applied voltage dependency of the MR change for the samples T1, T2 and T3. Here, the MR change normalized by the value at 0V is shown in the drawing. In the case of the sample T1 having a thin free layer, a bias voltage of $V_{1/2}$, at which the MR change is reduced to half, exceeds 0.9V to control the bias voltage dependency. On the other hand, in the case of the samples T2 and T3 having a thick free layer, the bias dependency is low compared to that of a ferromagnetic single tunnel junction element, but the $V_{1/2}$ is less than 0.8V. That is, they are clearly inferior to the sample T1.

It is evident from FIGS. 36 and 37 that the thinner free layer causes the more controlled increase according to finer junction and improvement of the bias voltage dependency. When the thickness of the free layer is 5 nm or less, the reversal magnetic field maybe controlled to 100 Oe or less in the case of the element by 0.25 μm rule, and the bias dependency of the MR change may be improved. However, when the thickness of a free layer becomes less than 1 nm, the free layer is not made a continuous film, and likely to be a so-called granular structure in which ferromagnetic particles are dispersed in a dielectric layer. Thus, it may be difficult to control the junction characteristics, and, depending on the size of the fine particles, they may be in a superparamagnetic state at a room temperature to cause remarkable reduction in the MR change. Therefore, the thickness of the free layer may be preferably 1 to 5 nm.

Embodiment 8

An embodiment, where an MRAM with a structure shown in FIG. 14 was made on a $Si/SiO_2$ substrate. $SiO_2$ was deposited on a Si substrate 151 by plasma CVD. A word line 152 was formed using a damascene process. That is, after application of a resist, a resist pattern was formed with photolithography, trenches were processed on the $SiO_2$ by the RIE, Cu was embedded into the trenches using the plating, and flattening was performed by CMP to form the word line 152.

Then, a $SiO_2$ interlayer insulation film with a thickness of 250 nm was formed on the word line 152 by plasma CVD.

The sample was put into a sputtering apparatus. After setting the initial pressure at $1 \times 10^{-8}$ Torr, Ar was introduced into the apparatus and the pressure was set at a predetermined value. Then, layers of a TaN underlayer/Cu (50 nm)/$Ni_{81}Fe_{19}$ (5 nm)/$Ir_{22}Mn_{78}$ (12 nm)/$Co_{50}Fe_{50}$ (3 nm)/$Al_2O_3$ (1 nm)/ $Co_{90}Fe_{10}$ (2 nm)/$Ni_{81}Fe_{19}$ (1 nm)/$Co_{90}Fe_{10}$ (2 nm)/Ru (0.9 nm)/$Co_{90}Fe_{10}$ (2 nm)/$Ni_{81}Fe_{19}$ (1 nm)/$Co_{90}Fe_{10}$ (2 nm)/ $Al_2O_3$ (1 nm)/$Co_{80}Fe_{20}$ (3 nm)/Ru (0.9 nm)/$Co_{80}Fe_{20}$/ $Ir_{22}Mn_{78}$ (12 nm)/$Ni_{81}Fe_{19}$ (5 nm)/Au protection film were stacked on the $SiO_2$ interlayer insulation film. The $Al_2O_3$ layer was formed by depositing Al using an Al target in pure Ar gas, by introducing oxygen into the apparatus without breaking the vacuum, and then by exposing it to the plasma oxygen.

After deposition of a $Si_3N_4$ layer on the above layered film and application of a resist, a resist pattern was formed by photolithography to form a hard mask defining a metal wire 153 by RIE. Then, ion milling was performed to process the stacked film. After that, the resist pattern was removed.

Next, the resist was applied, a resist pattern defining a junction dimensions was formed by photolithography. Then, the films above the first $Al_2O_3$ layer were processed by ion milling, thereby the TMR element was formed. All the cell size of the TMR elements was set to 0.4×0.4 μm². After that, the resist pattern was removed.

Next, after deposition of an $SiO_2$ interlayer insulation film by plasma CVD, the flattening was performed by polishing it to a thickness of 250 nm by CMP. Cu and an insulation film and Cu were stacked allover the surface. A $Si_3N_4$ film was deposited on the stacked film. After application of the resist, a resist pattern was formed by photolithography. After forming a hard mask by RIE, ion milling was performed to form a bit line 154, interlayer insulation layer 155 and the second word line 156. Then, after introduction into a heat-treating furnace in the magnetic field, uniaxial anisotropy was introduced to the magnetic recording layer, and unidirectional anisotropy to the magnetization pinned layer.

Writing was performed on the obtained MRAM by the following three methods.

(1) A method in which, while injecting the spin current of 1 mA into the TMR element, current pulses of 10 nsec is flowed in the word line 152 and the second word line 156 to apply a current magnetic field in an easy axis direction and hard axis direction of the magnetic recording layer 115.

(2) A method in which only injection of the spin current into the TMR element is performed.

(3) A method in which current pulses of 10 nsec is flowed in the word line 152 and the second word line 156 to apply a current magnetic field in an easy axis direction and hard axis direction of the magnetic recording layer 115.

The current pulse to apply current magnetic field in a hard axis direction of the magnetic recording layer 115 was set to constantly be 10 nsec and 3 mA.

The magnetization reversal of the magnetic recording layer 115 was decided by applying a direct current to the TMR cell after writing, and checking whether there was a change in the output voltage.

In the method of (2) in which only injection of a spin current into the TMR element is performed, there was found no magnetization reversal even when the current was increased to 10 mA. In the method of (3) in which the current magnetic field is applied in the direction of an easy axis and that of a hard axis of the magnetic recording layer 115, the current for applying the current magnetic field in the easy axis direction of magnetic recording layer 115 was required to be increased to 4.3 mA to cause the magnetization reversal.

On the other hand, according to the method of (1), when a current for applying the current magnetic field in an easy axis direction of the magnetic recording layer 115 was increased while injecting a spin current of 1 mA, it was confirmed that the magnetization reversal of the magnetic recording layer 115 was attained at a current of 2.6 mA. Moreover, it was found that repeated magnetization reversal of the magnetic recording layer 115 could be attained at the above low current, by changing the direction of the current for applying the current magnetic field in an easy axis direction of the magnetic recording layer 115 and that of the spin current flowing in the TMR element.

Thus, a suitable structure for injection of the spin current may be realized, and the current flowing in the wire for applying a current magnetic field and the current flowing in the TMR element may be reduced, if the structure of the MRAM and the writing method according to the present embodiments are used. Therefore, the melting of wire or the destruction of the tunnel barrier layer may be controlled to improve the reliability, even when the wire width and the size of TMR element are more reduced with higher density of the MRAM.

Embodiment 9

Figure 16:
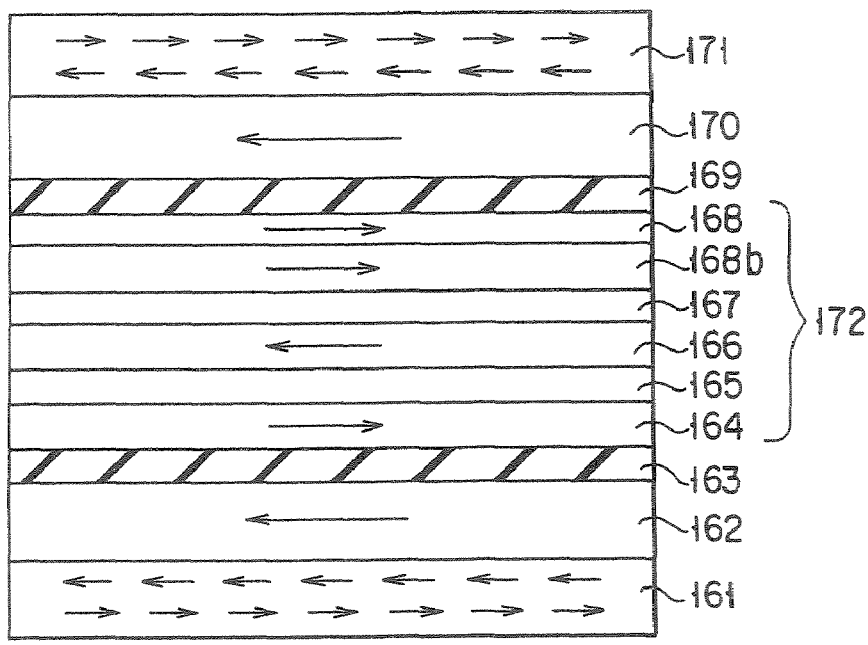
FIG. 16 shows a sectional view of still another example of a magnetoresistive element according to the present invention.
Figure 17:
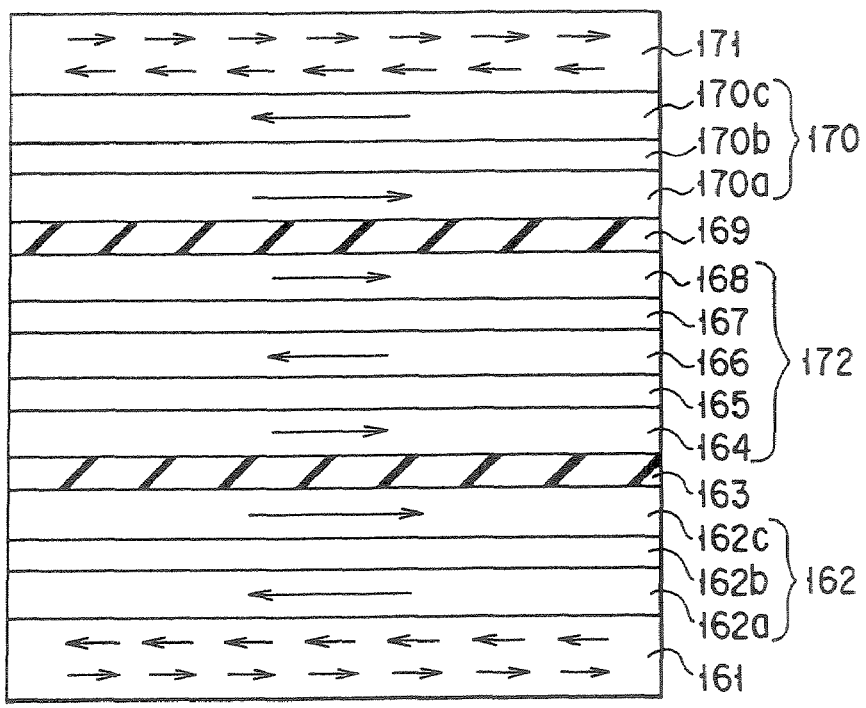
FIG. 17 shows a sectional view of still another example of a magnetoresistive element according to the present invention.

An embodiment, where a magnetoresistive element with a structure shown in FIG. 16 was made, will be described. On a thermal oxidized Si substrate 151, an underlayer of Ta (10 nm)/NiFe (10 nm), a first antiferromagnetic layer 161 of IrMn (50 nm), a first ferromagnetic layer 162 of $Co_9Fe$ (1.5 nm), a first tunnel insulator 163 of $Al_2O_3$ (1.5 nm), a second ferromagnetic layer 164 of $Co_9Fe$ (1.5 nm), a first nonmagnetic layer 165 of Ru (0.8 nm), a third ferromagnetic layer 166 of $Co_9Fe$ (1.5 nm), a second nonmagnetic layer 167 of Ru (0.8 nm), a ferromagnetic layer 168b of NiFe (2.0 nm), a fourth ferromagnetic layer 168 of $Co_9Fe$ (1.5 nm), a second tunnel insulator 169 of $Al_2O_3$ (1.5 nm), a fifth ferromagnetic layer 170 of $Co_9Fe$ (1.5 nm), and a second antiferromagnetic layer 171 of IrMn (50 nm) were sequentially stacked using a magnetron sputtering apparatus. In this element, the second ferromagnetic layer 164, the first nonmagnetic layer 165, the third ferromagnetic layer 166, the second nonmagnetic layer 167, the ferromagnetic layer 168b and the fourth ferromagnetic layer 168 constitute the magnetic recording layer 172. In the magnetic recording layer 172, the second and third ferromagnetic layers 164, 166 are antiferromagnetically coupled through the first nonmagnetic layer 165, and the third and fourth ferromagnetic layers 166 and 168 are antiferromagnetically coupled through the second nonmagnetic layer 167. The NiFe ferromagnetic layer 168b is provided so that the magnetization value M3 of the third ferromagnetic layer 166 and the total magnetization values M(2+4) of the second and fourth ferromagnetic layers 164 and 168 are made different from each other.

All the films were formed without breaking the vacuum. $Al_2O_3$ constituting the first and second tunnel insulators 163 and 169 was formed by plasma oxidation after spattering of Al metal. The underlayer, the first antiferromagnetic layer 161 and the first ferromagnetic layer 162 were deposited through a mask with an opening having a lower wire shape with a width of 100 μm. Al to be converted to the first tunnel insulator 163 was deposited through a mask with an opening having a shape of the junction. Each layer above the first tunnel insulator 163 was deposited through a mask with an opening having a shape of the upper wire with a width of 100 μm extending in the direction perpendicular to the lower wire. In the above processing, the above masks were exchanged in the vacuum chamber. Thus, the junction area was made 100× 100 $μm^2$. The uniaxial anisotropy was introduced in the film surface by applying the magnetic field of 100 Oe at deposition It was observed from the measurements of the magnetic resistance for the above magnetoresistive elements, using the four-terminal method, that there was 22% of an MR change under a low switching magnetic field of about 10 Oe, respectively.

Embodiment 10

Magnetoresistive elements with smaller junction area than that of the Embodiment 9, and with the similar stacked structure to that of the Embodiment 9 by fine processing using the photolithography were made. The area of the tunnel junction was made 5×5 $μm^2$, 1×1 $μm^2$, or 0.4×0.4 $μm^2$.

It was observed from the measurements of the magnetic resistance for the above magnetoresistive elements, using the four-terminal method, that there was an MR change under a low switching magnetic field of 12 Oe, 25 Oe, and 35 Oe, respectively. There was no remarkable increase in the switching magnetic field even under he small junction area as shown above. The reason is supposed to be that, the generated diamagnetic field does not depend on the element size so much, as layered magnetic films antiferromagnetically coupled are used for the magnetic recording layer.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

The invention claimed is:

1. A method for writing information to a magnetic memory device comprising a first magnetization pinned layer whose magnetization direction is pinned, a first dielectric layer, a magnetic recording layer whose magnetization direction is reversible, a second dielectric layer, and a second magnetization pinned layer whose magnetization direction is pinned, the method comprising:
   supplying a spin current through the first or second magnetization pinned layer to the magnetic recording layer; and
   applying a current magnetic field to the magnetic recording layer by allowing a current to flow in a writing wire.

* * * * *